United States Patent
Asako et al.

(10) Patent No.: US 10,541,681 B2
(45) Date of Patent: Jan. 21, 2020

(54) DRIVE CIRCUIT FOR SWITCH

(71) Applicant: DENSO CORPORATION, Kariya, Aichi-pref (JP)

(72) Inventors: Yosuke Asako, Kariya (JP); Akira Tokumasu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/160,182

(22) Filed: Oct. 15, 2018

(65) Prior Publication Data

US 2019/0123732 A1  Apr. 25, 2019

(30) Foreign Application Priority Data

Oct. 20, 2017  (JP) .................................. 2017-203244

(51) Int. Cl.
*H03K 17/687* (2006.01)
*H03K 17/082* (2006.01)

(52) U.S. Cl.
CPC .  *H03K 17/0828* (2013.01); *H03K 2217/0027* (2013.01)

(58) Field of Classification Search
CPC ........... H03K 17/04126; H03K 17/127; H03K 17/122; H03K 17/0822; H03K 17/0828; H03K 17/063; H03K 19/00361; H03K 2217/0036; H03K 2217/0027
See application file for complete search history.

(56) References Cited

U.S. PATENT DOCUMENTS

| | | | |
|---|---|---|---|
| 2012/0280728 A1* | 11/2012 | Hussein | H03K 17/127 327/432 |
| 2016/0126718 A1 | 5/2016 | Naito et al. | |
| 2017/0302152 A1* | 10/2017 | Watanabe | H02M 1/088 |

* cited by examiner

*Primary Examiner* — Long Nguyen
(74) *Attorney, Agent, or Firm* — Oliff PLC

(57) ABSTRACT

A drive circuit drives a plurality of switches and sets a target threshold as a threshold compared to a physical quantity correlated with current flowing to a switching completion switch driven to complete switching from one of first and second states to the other. In the first state, a flow of current to at least one of the switches is allowed. In the second state, a flow of current to all of the switches is blocked. The drive circuit sets the target threshold to a first target threshold during at least a part of a first on-driving period in which only a switching completion switch is being on-driven and sets the target threshold to a second target threshold during at least a part of a second on-driving period in which all of the plurality of switches are being on-driven. The first target threshold is greater than the second target threshold.

20 Claims, 21 Drawing Sheets

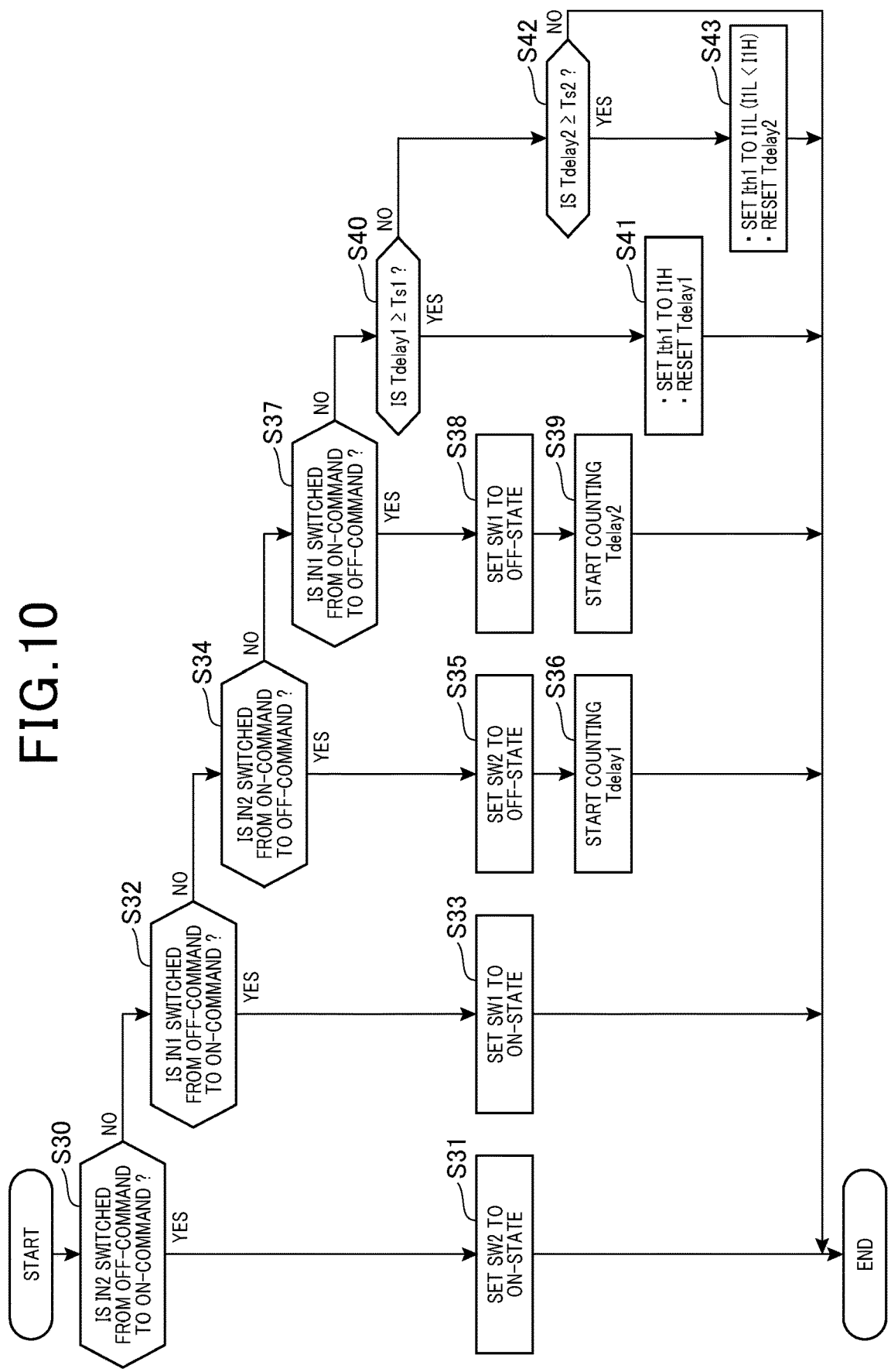

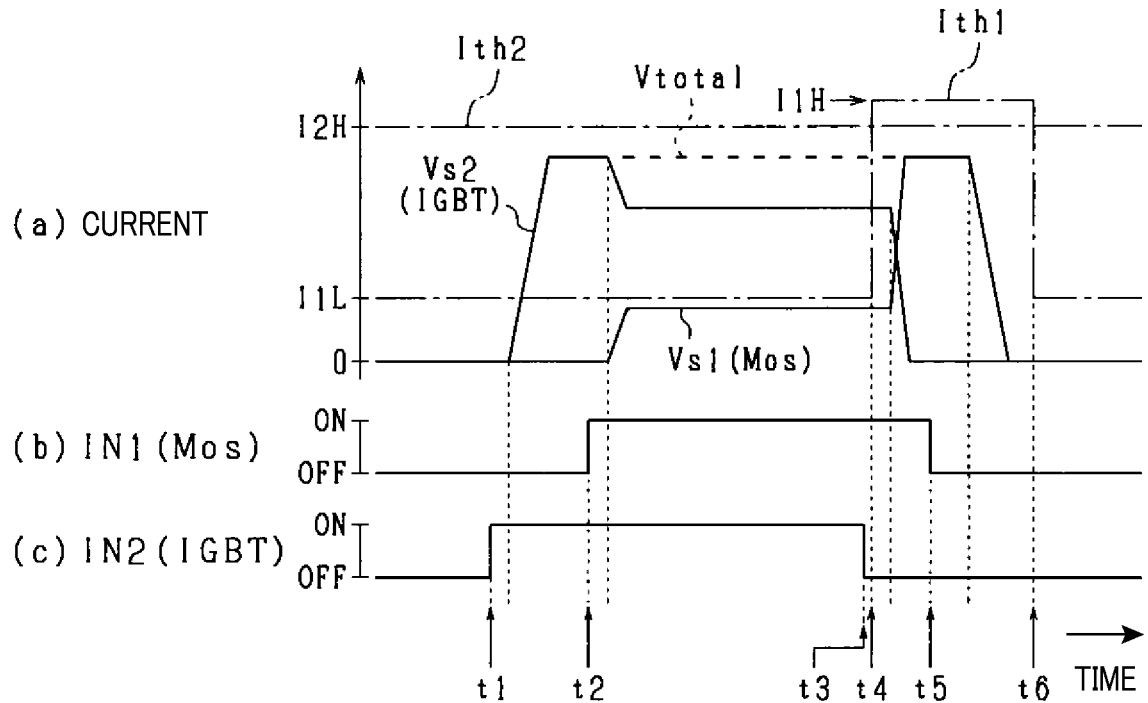
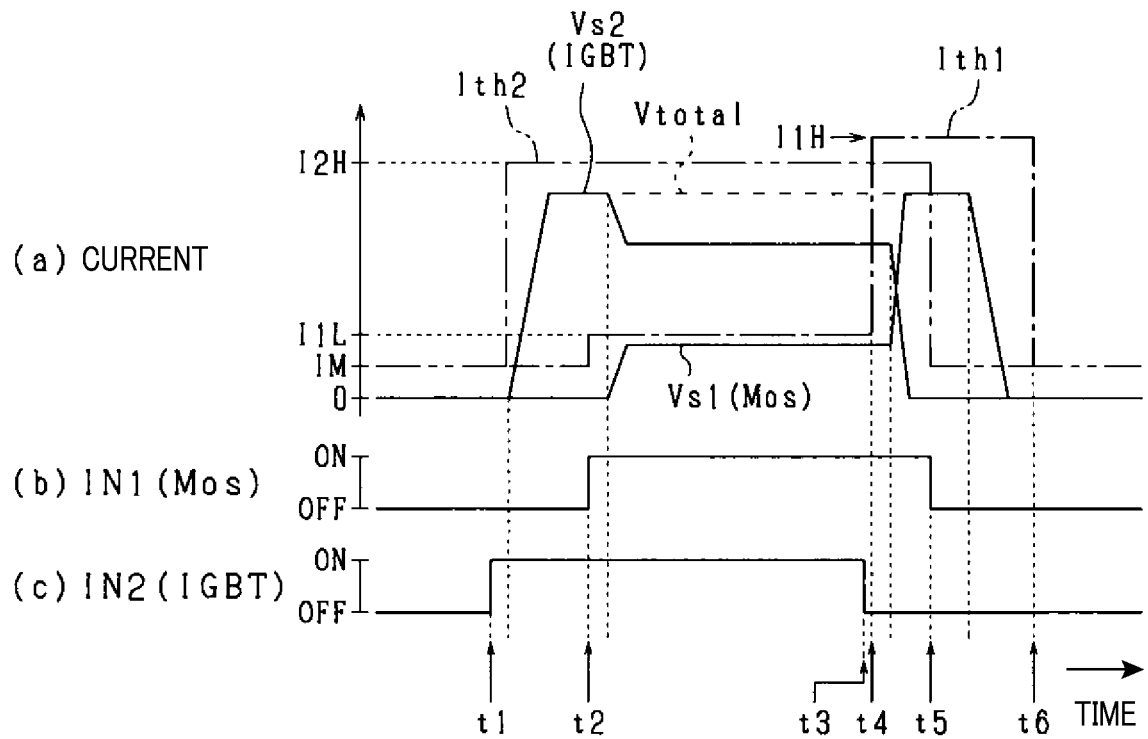

DRIVE CIRCUIT FOR SWITCH

CROSS-REFERENCE TO RELATED APPLICATION

This application is based on and claims the benefit of priority from Japanese Patent Application No. 2017-203244, filed Oct. 20, 2017. The entire disclosure of the above application is incorporated herein by reference.

BACKGROUND

Technical Field

The present disclosure relates to a drive circuit for a switch that drives a plurality of switches that are connected in parallel to each other.

Related Art

For example, as described in JP-A-2016-92907, a drive circuit that includes a current detecting unit and an overcurrent determining unit is known, as this type of drive circuit. The current detecting unit detects a current that flows to each of the plurality of switches that are connected in parallel to each other. The overcurrent determining unit determines whether or not a detection value of the current detecting unit has increased and exceeds a threshold.

In a configuration for driving the plurality of switches that are connected in parallel to each other, it is assumed that an appropriate threshold differs based on a driving state of each switch.

Here, it is assumed that an appropriate current threshold differs based on the driving state of each switch not only in the configuration in which a determination is made regarding whether or not the current detection value has increased and exceeds the threshold, but also in a configuration in which a determination is made regarding whether or not a temperature detection value of the switch has increased and exceeds a threshold.

SUMMARY

It is thus desired to provide a drive circuit for a switch that is capable of appropriately setting a threshold that is used to determine whether or not a switch is in an overcurrent state or an overheating state, based on a driving state of each switch.

An exemplary embodiment of the present disclosure provides a drive circuit for a switch. The drive circuit drives a plurality of switches that are connected in parallel to each other. The drive circuit includes a determining unit and a setting unit. The determining unit determines whether or not a detection value of a detecting unit exceeds a threshold. The detecting unit detects a physical quantity that is correlated with a current that flows to at least one of the plurality of switches. The setting unit sets a target threshold as the threshold that is compared to the physical quantity that is correlated with the current that flows to a switching completion switch among the plurality of switches. The switching completion switch is a switch that is driven to complete switching from one of first and second states to the other of the first and second states. The first state is a state in which a flow of current to at least one of the plurality of switches is allowed. The second state is a state in which a flow of current to all of the switches is blocked. The setting unit sets the target threshold to a first target threshold during at least a part of a first on-driving period in which only a switching completion switch is being on-driven and sets the target threshold to a second target threshold during at least a part of a second on-driving period in which all of the plurality of switches are being on-driven. The first target threshold is greater than the second target threshold.

During at least a part of the on-driving period of only the switching completion switch among the plurality of switches, the current is concentrated at the switching completion switch among the plurality of switches. Therefore, during at least a part of the on-driving period of only the switching completion switch, the current that flows to the switching completion switch is high and the temperature of the switching completion switch is high, compared to the current and the temperature during the on-driving period of all of the plurality of switches.

For example, setting the threshold with reference to the physical quantity that is correlated with the current that flows to the switching completed switch during at least a part of the on-driving period of the switching completion switch can be considered. However, in this case, the threshold during the on-driving period of all of the plurality of switches is set to be greater in relation to the physical quantity that is correlated with the current that flows to the switching completion switch. As a result, for example, an overcurrent state or an overheating state of the switching completion switch may not be promptly determined.

Meanwhile, for example, setting the threshold with reference to the physical quantity that is correlated with the current that flows to the switching completion switch during the on-driving period of all of the plurality of switches can also be considered. However, in this case, the threshold during at least a part of the on-driving period of only the switching completion switch is set to be less in relation to the physical quantity that is correlated to the current that flows to the switching completion switch.

As a result, for example, regardless of the switching completion switch not being in an overcurrent state or an overheating state, the physical quantity exceeds the threshold during at least a part of the on-driving period of only the switching completion switch. An erroneous determination that the switching completion switch is in an overcurrent state or an overheating state may be made.

Therefore, in the present exemplary embodiment, when the threshold that is compared to the physical quantity that is correlated with the current that flows to the switching completion switch is the target threshold, the target threshold during at least a part of the on-driving period of only the switching completion switch of the plurality of switches is set to be greater than the target threshold during at least a part of the on-driving period of all of the plurality of switches.

As a result of this setting, the occurrence of an erroneous determination during the on-driving period of only the switching completion switch can be suppressed. At the same time, for example, when an overcurrent state or an overheating state occurs during the on-driving period of all of the plurality of switches, the switching completion switch being in such a state can be promptly detected. In this way, as a result of the present disclosure, the threshold can be appropriately set based on the driving state of each switch.

BRIEF DESCRIPTION OF THE DRAWINGS

In the accompanying drawings:

FIG. 10 is a flowchart of the steps in a threshold setting process according to a second embodiment;

FIG. 11 is a timing chart of a threshold setting mode;

FIG. 12 is a timing chart of a threshold setting mode in a variation example 2 according to the second embodiment;

DESCRIPTION OF THE EMBODIMENTS

First Embodiment

A first embodiment implementing a drive circuit of the present disclosure will hereinafter be described with reference to the drawings.

Figure 1:
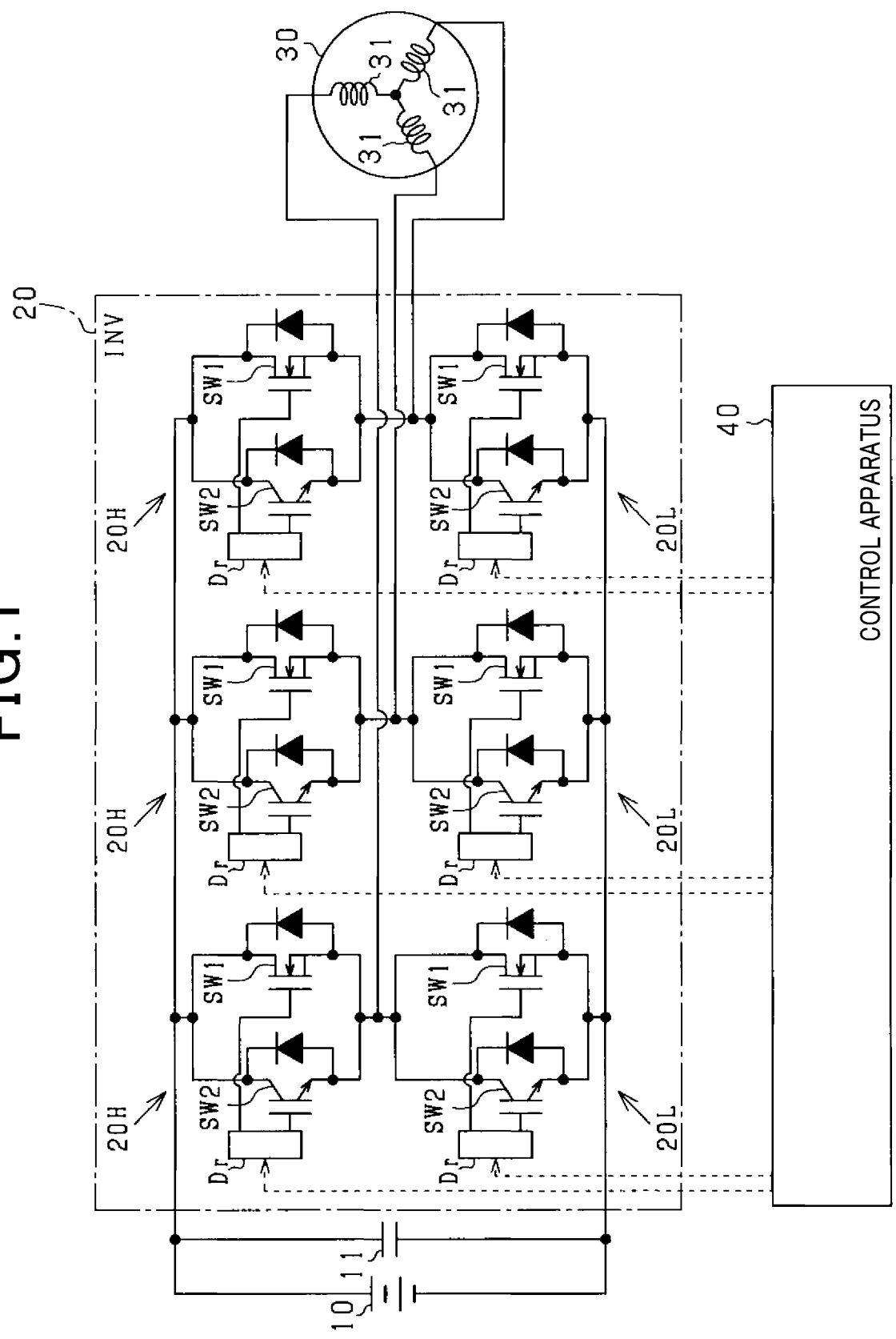
FIG. 1 is an overall configuration diagram of a control system of a rotating electric machine according to a first embodiment.

As shown in FIG. 1, a control system includes a direct-current power supply 10, an inverter 20, a rotating electric machine 30, and a control apparatus 40.

For example, the rotating electric machine 30 is an onboard main machine. The rotating electric machine 30 is electrically connected to the direct-current power supply 10 with the inverter 20 therebetween. According to the present embodiment, a three-phase rotating electric machine is used as the rotating electric machine 30. For example, a permanent magnet synchronous motor can be used as the rotating electric machine 30.

In addition, for example, the direct-current power supply 10 is a storage battery that has a terminal voltage that is equal to or higher than 100 volts. For example, the direct-current power supply 10 is a secondary battery such as a lithium-ion storage battery or a nickel-hydrogen storage battery. A capacitor 11 is connected in parallel to the direct-current power supply 10.

The inverter 20 includes an upper-arm switch unit 20H and a lower-arm switch unit 20L in correspondence to each phase. In each phase, the upper-arm switch unit 20H and the lower-arm switch unit 20L are connected in series. In each phase, one end of a winding 31 of the rotating electric machine 30 is connected to a connection point between the upper-arm switch unit 20H and the lower-arm switch unit 20L. The other end of the winding 31 of each phase is connected to a neutral point.

Each of the switch units 20H and 20L includes a parallel-connection body that is composed of a first switch SW1 and a second switch SW2. In each phase, a positive electrode side of the direct-current power supply 10 is connected to respective input terminals of the first switch SW1 and the second switch SW2 of the upper-arm switch unit 20H. In each phase, a negative electrode side of the direct-current power supply 10 is connected to respective output terminals of the first switch SW1 and the second switch SW2 of the lower-arm switch unit 20L. In each phase, respective input terminals of the first switch SW1 and the second switch SW2 of the lower-arm switch unit 20L are connected to respective output terminals of the first switch SW1 and the second switch SW2 of the upper-arm switch unit 20H.

According to the present embodiment, the first switch SW1 is an N-channel metal-oxide-semiconductor field-effect transistor (MOSFET) that is a silicon carbide (SiC) device. Therefore, in the first switch SW1, the output terminal is a source and the input terminal is a drain. In addition, the second switch SW2 is an insulated-gate bipolar transistor (IGBT) that is a Si device. Therefore, in the second switch SW2, the output terminal is an emitter and the input terminal is a collector. A free-wheeling diode is connected in anti-parallel to each of the second switches SW2. In addition, a parasitic diode is formed in each of the first switches SW1. Here, a free-wheeling diode may be connected in anti-parallel to each of the first switch SW1.

Figure 2:
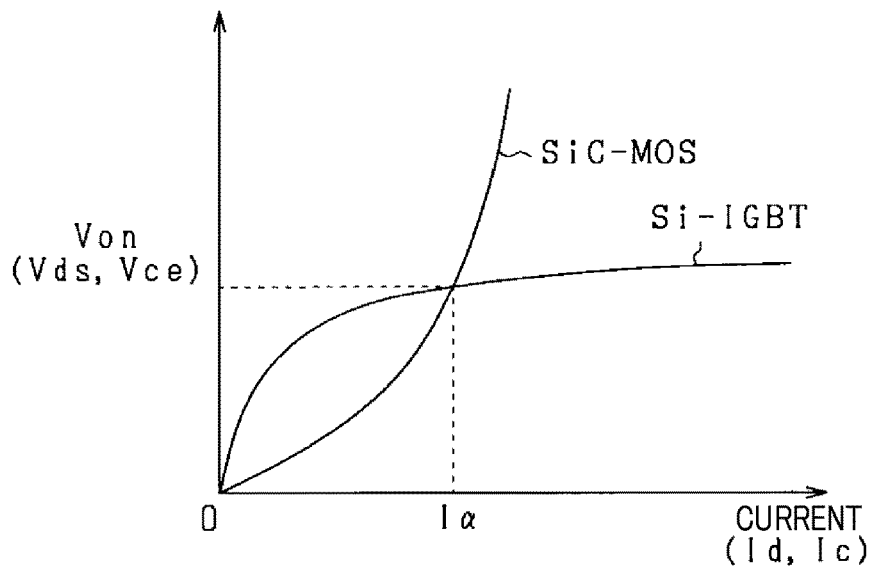
FIG. 2 is a diagram of current and voltage characteristics of first and second switches.

Each of the switch units 20H and 20L is configured by the parallel-connection body composed of the IGBT and the MOSFET for a following reason. That is, loss in a small-current region can be reduced by more current being sent to the MOSFET that has a lower on-resistance in the small-current region. This will be described hereafter with reference to FIG. 2. FIG. 2 is a diagram of a relationship between a current that flows to a switch and a voltage Von across the input and output terminals of the switch. Specifically, FIG. 2 shows voltage and current characteristics of a source-drain voltage Vds and a drain current Id of the MOSFET, and voltage and current characteristics of a collector-emitter voltage Vce and a collector current Ic of the IGBT.

As shown in FIG. 2, in the small-current region in which the current is smaller than a predetermined current Iα, the drain-source voltage Vds in relation to the current Id is lower than the collector-emitter voltage Vce in relation to the collector current Ic. That is, in the small-current region, the on-resistance of the MOSFET is lower than the on-resistance of the IGBT. Therefore, in the small-current region, more current flows to the MOSFET, of the MOSFET and the IGBT that are connected in parallel to each other.

Meanwhile, in a large-current region in which the current is larger than the predetermined current Iα, the collector-emitter voltage Vce in relation to the collector current Ic is lower than the drain-source voltage Vds in relation to the drain current Id. That is, in the large-current region, the on-resistance of the IGBT is lower than the on-resistance of the MOSFET. Therefore, in the large-current region, more current flows to the IGBT, of the MOSFET and the IGBT that are connected in parallel to each other.

The control apparatus 40 drives the inverter 20 so as to control a controlled variable of the rotating electric machine 30 to a command value of the controlled variable. For example, the controlled variable is torque. The control apparatus 40 outputs a drive signal that corresponds to each of the switches SW1 and SW2 of the inverter 20 to a drive circuit Dr that is individually provided for each of the switch units 20H and 20L, so as perform on/off-driving of each of the switches SW1 and SW2.

For example, the control apparatus 40 generates the drive signal that corresponds to the drive circuit Dr by performing a pulse width modulation (PWM) process based on a comparison of magnitudes of three-phase command voltages of which the phases are shifted from each other by an electrical angle of 120 degrees, and a carrier signal such as a triangular wave signal. The drive signal is set to either an on-command or an off-command. As a result of the on-command, an instruction to perform on-driving of the switch is issued. As a result of the off-command, an instruction to perform off-driving the switch is issued.

According to the present embodiment, the on-command is expressed by a logical H signal. The off-command is expressed by a logical L signal. In each phase, the drive signal on the upper-arm side and the drive signal on the corresponding lower-arm side are alternately set to the on-command. Therefore, in each phase, the switches SW1 and SW2 of the upper-arm switch unit 20H and the switches SW1 and SW2 of the lower-arm switch unit 20L are alternately set to the on-state.

Figure 3:
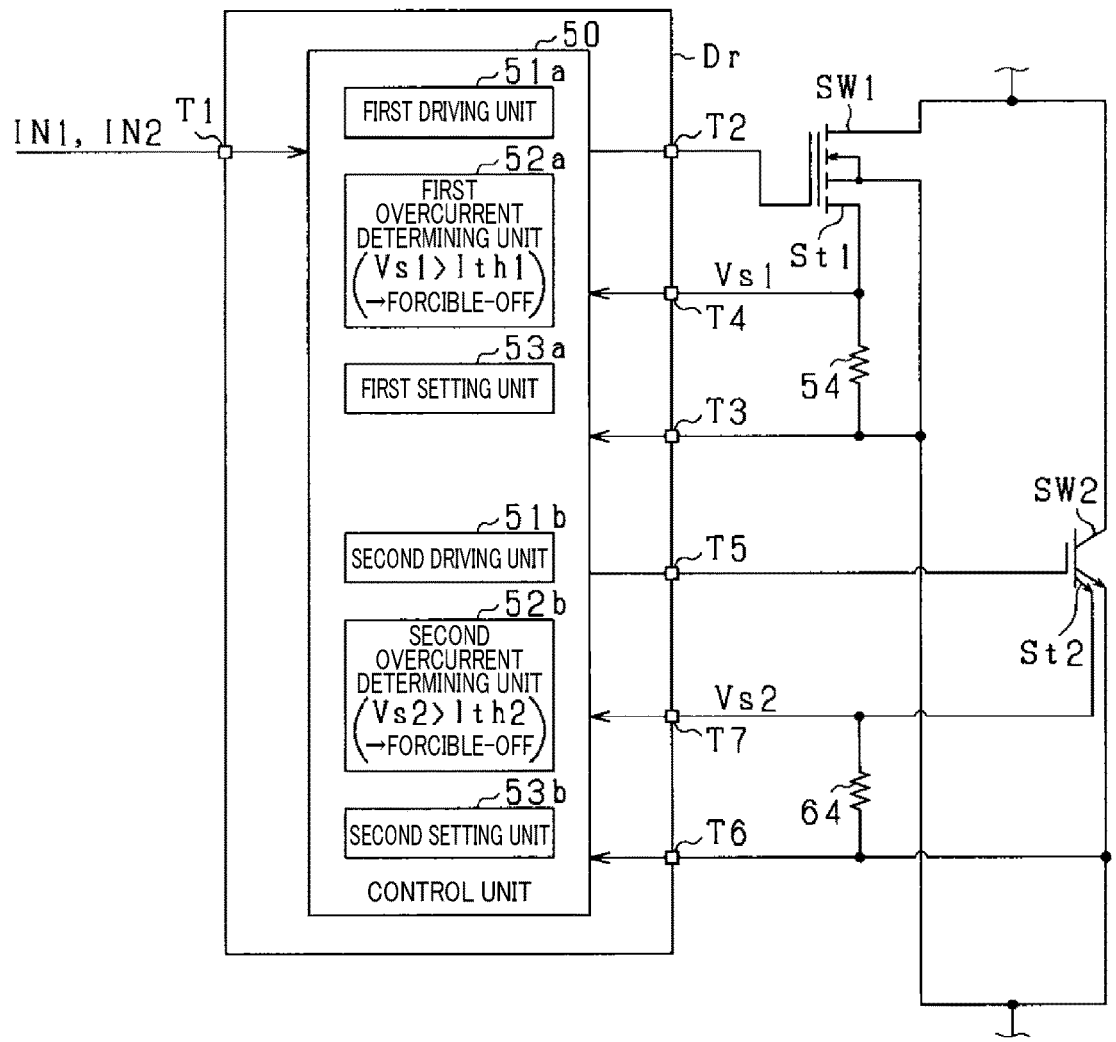
FIG. 3 is a diagram of a drive circuit.

Next, a configuration of the drive circuit Dr will be described with reference to FIG. 3. The drive circuits Dr respectively corresponding to the switch units 20H and 20L according to the present embodiment basically have a same configuration. For example, functions provided by the drive circuit Dr can be provided by software that is recorded in a tangible memory apparatus and a computer that runs the software, hardware, or a combination of the software and the hardware.

The drive circuit Dr includes a control unit 50. The control unit 50 includes a first driving unit 51a. The first driving unit 51a performs on/off-driving of the first switch SW1 based on a first drive signal IN1 that is inputted from the control apparatus 40 via a first terminal T1 of the drive circuit Dr. When the first drive signal IN1 is acquired and the acquired first drive signal IN1 is determined to be the on-command, the first driving unit 51a performs on-driving in which the gate of the first switch SW1 is charged with electric charge via a second terminal T2 of the drive circuit Dr. As a result of on-driving, a gate voltage of the first switch SW1 becomes equal to or higher than a first threshold Vth1. As a result, the first switch SW1 is switched from an off-state to an on-state.

The on-state is a state in which a flow of current to the switch is allowed. The off-state is a state in which the flow of current to the switch is blocked. The first threshold voltage Vth1 is a voltage at which the first switch SW1 is switched from either of the on-state and the off-state to the other. When the acquired first drive signal IN1 is determined to be the off-command, the first driving unit 51a performs off-driving to discharge electric charge from the gate of the first switch SW1 via the second terminal T2. As a result of off-driving, the gate voltage of the first switch SW1 becomes lower than the first threshold voltage Vth1. As a result, the first switch SW1 is switched from the on-state to the off-state.

The first switch SW1 includes a first sense terminal St1 that outputs a minute current that is correlated with the drain current that flows to the first switch SW1 itself. A first end of a first resistor 54 is connected to the first sense terminal St1. A third terminal T3 of the drive circuit Dr and the source of the first switch SW1 are connected to a second end of the first resistor 54. A voltage drop occurs in the first resistor 54 as a result of the minute current outputted from the first sense terminal St1.

According to the present embodiment, a potential on the first end side of the first resistor 54 in relation to a source potential of the first switch SW1 is referred to as a first sense voltage Vs1. A fourth terminal T4 of the drive circuit Dr is connected to the first end of the first resistor 54. The control unit 50 acquires the first sense voltage Vs1 via the fourth terminal T4.

According to the present embodiment, when the source potential of the first switch SW1 is zero and the potential on the first end side of the first resistor 54 is higher than the source potential, the first sense voltage Vs1 is defined as being positive. In addition, according to the present embodiment, the first sense terminal St1 and the first resistor 54 correspond to a current detecting unit that is provided in correspondence with the first switch SW1.

The control unit 50 includes a second drive unit 51b. The second driving unit 51b performs on/off-driving of the second switch SW2 based on a second drive signal IN2 that is inputted from the control apparatus 40 via the first terminal T1.

When the second drive signal IN2 is acquired and the acquired second drive signal IN2 is determined to be the on-command, the second driving unit 51b performs on-driving in which the gate of the second switch SW2 is charged with electric charge via a fifth terminal T5 of the drive circuit Dr. As a result of on-driving, a gate voltage of the second switch SW2 becomes equal to or higher than a second threshold Vth2. As a result, the second switch SW2 is switched from the off-state to the on-state. The second threshold voltage Vth2 is a voltage at which the second switch SW2 is switched from either of the on-state and the off-state to the other.

When the acquired second drive signal IN2 is determined to be the off-command, the second driving unit 51b performs off-driving to discharge electric charge from the gate of the second switch SW2 via the fifth terminal T5. As a result of off-driving, the gate voltage of the second switch SW2 becomes lower than the second threshold voltage Vth2. As a result, the second switch SW2 is switched from the on-state to the off-state.

The second switch SW2 includes a second sense terminal St2 that outputs a minute current that is correlated with the collector current that flows to the second switch SW2 itself. A first end of a second resistor 64 is connected to the second sense terminal St2. A sixth terminal T6 of the drive circuit Dr and the emitter of the second switch SW2 are connected to a second end of the second resistor 64.

According to the present embodiment, a potential on the first end side of the second resistor 64 in relation to a source potential of the second switch SW2 is referred to as a second sense voltage Vs2. A seventh terminal T7 of the drive circuit Dr is connected to the first end of the second resistor 64. The control unit 50 acquires the second sense voltage Vs2 via the seventh terminal T7.

According to the present embodiment, when the emitter potential of the second switch SW2 is zero and the potential on the first end side of the second resistor 64 is higher than the emitter potential, the second sense voltage Vs2 is defined as being positive. In addition, according to the present embodiment, the second sense terminal St2 and the second resistor 64 correspond to a current detecting unit that is provided in correspondence with the second switch SW2.

The control unit 50 includes a first overcurrent determining unit 52a and a first setting unit 53a. When the acquired first sense voltage Vs1 is determined to exceed a first current threshold Ith1, the first overcurrent determining unit 52a instructs the first drive unit 51a and the second drive unit 51b to forcibly switch the first and second switches SW1 and SW2 to the off-state by off-driving. The first setting unit 53a sets the first current threshold Ith1 that is used by the first overcurrent determining unit 52a based on the driving states of the first and second switches SW1 and SW2.

The control unit 50 includes a second overcurrent determining unit 52b and a second setting unit 53b. When the acquired second sense voltage Vs2 is determined to exceed a second current threshold Ith2, the second overcurrent determining unit 52b instructs the first drive unit 51a and the second drive unit 51b to forcibly switch the first and second switches SW1 and SW2 to the off-state by off-driving. The second setting unit 53b sets the second current threshold Ith2 that is used by the second overcurrent determining unit 52b based on the driving states of the first and second switches SW1 and SW2.

According to the present embodiment, a rated value (rated current) of the collector current Ic that is able to flow to the second switch SW2 is set to be greater than a rated value (rated current) of the drain current Id that is able to flow to the first switch SW1. Therefore, the second current threshold Ith2 is set to be greater than the first current threshold Ith1. According to the present embodiment, the first and second overcurrent determining units 52a and 52b correspond to a forcible-off unit. In addition, according to the present embodiment, the rated current of the second switch SW2 is larger than the predetermined current Iα shown in FIG. 2, described earlier.

Here, when the first sense voltage Vs1 is determined to exceed the first current threshold Ith1, the first overcurrent determining unit 52a may issue an instruction to forcibly switch only the first switch SW1 to the off-state, rather than both the first and second switches SW1 and SW2. In addition, when the second sense voltage Vs2 is determined to exceed the second current threshold Ith2, the second overcurrent determining unit 52b may issue an instruction to forcibly switch only the second switch SW2 to the off-state, rather than both the first and second switches SW1 and SW2.

According to the present embodiment, the first and second driving units 51a and 51b drive the first and second switches SW1 and SW2 by a direct-current (DC) assist process. In the DC assist process, first, the second switch SW2 is switched to on-driving. Then, the first switch SW1 is switched to on-driving. Subsequently, in a state in which on-driving is performed for both the first and second switches SW1 and SW2, the first switch SW1 is first switched to off-driving. Then, the second switch SW2 is switched to off-driving.

According to the present embodiment, the second switch SW2 corresponds to a switching completion switch. The first and second drive units 51a and 51b correspond to a DC on-driving unit and a DC off-driving unit.

The second switch SW2 is first switched to on-driving and lastly switched to off-driving because a withstand current of the second switch SW2 is greater than a withstand current of the first switch SW1. According to the present embodiment, the withstand current is a value that is greater than the rated current and is a maximum value of a current that can temporarily be sent to the switch without causing a malfunction in the switch.

The second setting unit 53b sets the second current threshold Ith2 (second large-current-side threshold I2H corresponding to a first target threshold) during an on-driving period (first on-driving period) of only the second switch SW2, of the first and second switches SW1 and SW2, to be greater than the second current threshold Ith2 (second small-current-side threshold I2L corresponding to a second target threshold) in at least an intermediate period of an on-driving period (second on-driving period) of both the first and second switches SW1 and SW2.

As a result, occurrence of an erroneous determination that an overcurrent is flowing during the on-driving period of only the second switch SW2 is suppressed. At the same time, when an overcurrent state occurs during the on-driving period of the first and second switches SW1 and SW2, the first and second switches SW1 and SW2 are promptly switched to the off-state. According to the present embodiment, the second current threshold Ith2 corresponds to a target threshold.

Meanwhile, the first setting unit 53a fixes the first current threshold Ith1 to a first small-current-side threshold I1L and does not change the first current threshold Ith1. According to the present embodiment, under a condition that the first small-current-side threshold I1L is less than the second current threshold Ith2, the first small-current-side threshold I1L is set to a value that is equal to or greater than the rated current of the first switch SW1 and equal to or less than the withstand current of the first switch SW1.

Figure 4:
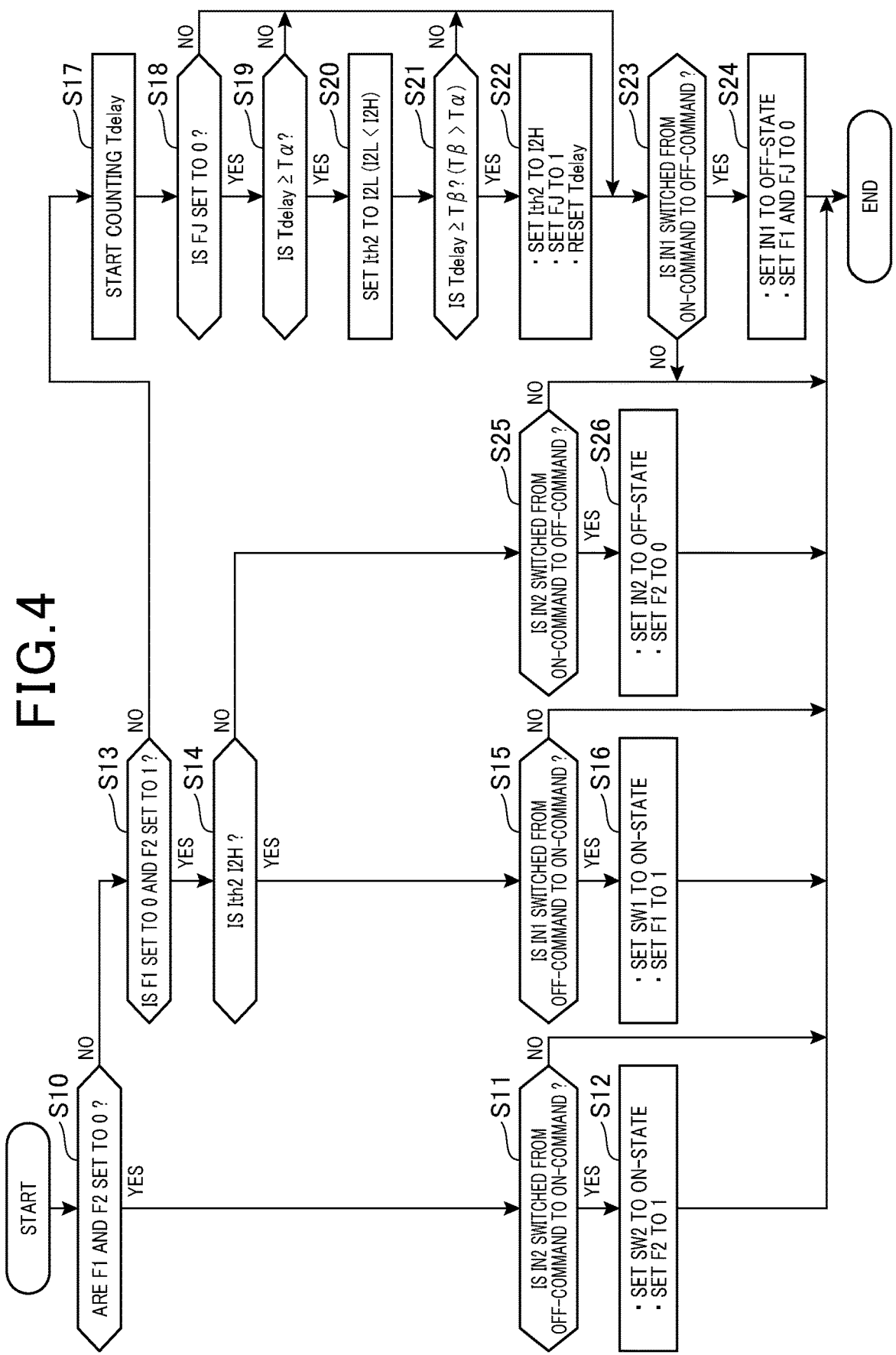
FIG. 4 is a flowchart of the steps in a threshold setting process.

FIG. 4 shows the steps in a threshold setting process performed by the control unit 50 that includes the second setting unit 53b. The control unit 50 repeatedly performs the process at a predetermined control period (control cycle). An initial value of the second current threshold Ith2 is set to the second large-current-side threshold I2H.

In this series of processes, first, at step S10, the control unit 50 determines whether or not a first flag F1 and a second flag F2 are both set to 0. The first flag F1 being set to 0 indicates that the first drive signal IN1 is the off-command. The first flag F1 being set to 1 indicates that the first drive signal IN1 is the on-command. The initial values of the first and second flags F1 and F2 are 0.

When determined YES at step S10 (i.e., the first flag F1 and the second flag F2 are both set to 0), the control unit 50 proceeds to step S11. The control unit 50 determines whether or not the second drive signal IN2 is switched from the off-command to the on-command during the current control period.

When determined NO at step S11 (i.e., the second drive signal IN2 is not switched from the off-command to the on-command), the control unit 50 temporarily ends the series of processes. Meanwhile, when determined YES at step S11 (i.e., the second drive signal IN2 is switched from the off-command to the on-command), the control unit 50 proceeds to step S12. At step S12, the control unit 50 switches the second switch SW2 to the on-state by on-driving. In addition, the control unit 50 sets the second flag F2 to 1. The control unit 50 then temporarily ends the series of processes.

When determined NO at step S10 (i.e., the first flag F1 and the second flag F2 are not both set to 0), the control unit 50 proceeds to step S13. At step S13, the control unit 50 determines whether or not the first flag F1 is set to 0 and the second flag F2 is set to 1. When determined YES at step S13 (i.e., the first flag F1 is set to 0 and the second flag F2 is set to 1), the control unit 50 proceeds to step S14.

At step S14, the control unit 50 determines whether or not the second current threshold Ith2 is the second large-current-side threshold I2H. The control unit 50 performs the process at step S14 to determine whether the current state is a state in which the first switch SW1 is to be switched to the on-state or a state in which the second switch SW2 is to be switched to the off-state.

According to the present embodiment, the second large-current-side threshold I2H is set to a value that is equal to or greater than the withstand current of the second switch SW2. Specifically, for example, the second large-current-side threshold I2H is set to the same value as the withstand current of the second switch SW2.

When determined YES at step S14 (i.e., the second current threshold Ith2 is the second large-current-side threshold I2H), the control unit 50 determines that the current state is the state in which the first switch SW1 is to be switched to the on-state, and proceeds to step S15. At step S15, the control unit 50 determines whether or not the first drive signal IN1 is switched from the off-command to the on-command during the current control period.

When determined NO at step S15 (i.e., the first drive signal IN1 is not switched from the off-command to the on-command), the control unit 50 temporarily ends the series of processes. Meanwhile, when determined YES at step S15 (i.e., the first drive signal IN1 is switched from the off-command to the on-command), the control unit 50 proceeds to step S16. At step S16, the control unit 50 switches the first switch SW1 to the on-state by on-driving. In addition, the control unit 50 sets the first flag F1 to 1. The control unit 50 then temporarily ends the series of processes.

When determined NO at step S13 (i.e., the first flag F1 is not set to 0 or the second flag F2 is not set to 1), the control unit 50 determines that the first flag F1 and the second flag F2 are both set to 1 and then proceeds to step S17. At step S17, the control unit 50 starts to count an elapsed time Tdelay.

At step S18, the control unit 50 determines whether or not an elapsed-time flag FJ is set to 0. The elapsed-time flag FJ being set to 1 indicates that a state in which the second current threshold Ith2 is to be set to the second large-current-side threshold I2H. The initial value of the elapsed-time flag FJ is 0.

When determined that the elapsed-time flag FJ is set to 0 (YES at step S18), the control unit 50 proceeds to step S19. At step S19, the control unit 50 determines whether or not the elapsed time Tdelay is equal to or greater than a first delay time Tα. The control unit 50 performs the process at step S19 to determine whether or not a current timing is a timing at which the second current threshold Ith2 is to be decreased.

When determined YES at step S19 (i.e., the elapsed time Tdelay is equal to or greater than the first delay time Tα), the control unit 50 proceeds to step S20. The control unit 50 sets the second current threshold Ith2 to the second small-current-side threshold I2L. According to the present embodiment, the second small-current-side threshold I2L is set to a value that is equal to or greater than the rated current of the second switch SW2.

At subsequent step S21, the control unit 50 determines whether or not the elapsed time Tdelay is equal to or greater than a second delay time Tβ that is longer than the first delay time Tα. The control unit 50 performs the process at step S21 to determine whether or not the current timing is a timing at which the second current threshold Ith2 is to be increased. When determined YES at step S21 (i.e., the elapsed time Tdelay is equal to or greater than the second delay time Tβ), the control unit 50 proceeds to step S22. At step S22, the control unit 50 switches the second current threshold Ith2 from the second small-current-side threshold I2L to the second large-current-side threshold I2H. In addition, the control unit 50 sets the elapsed-time flag FJ to 1 and resets the elapsed time Tdelay to 0.

Upon completion of the process at step S22 or when determined NO at step S18 (i.e, an elapsed-time flag FJ is not set to 0), NO at step S19 (i.e, the elapsed time Tdelay is less than the first delay time Tα), or NO at step S21 (i.e, the elapsed time Tdelay is less than the second delay time Tβ), the control unit 50 proceeds to step S23. At step S23, the control unit 50 determines whether or not the first drive signal IN1 is switched from the on-command to the off-command during the current control period.

When determined NO at step S23 (i.e., the first drive signal IN1 is not switched from the on-command to the off-command), the control unit 50 temporarily ends the series of processes. Meanwhile, when determined YES at step S23 (i.e., the first drive signal IN1 is switched from the on-command to the off-command), the control unit 50 proceeds to step S24. At step S24, the control unit 50 switches the first switch SW1 to the off-state by off-driving. In addition, the control unit 50 sets the first flag F1 and the elapsed-time flag FJ to 0. The control unit 50 then temporarily ends the series of processes.

When determined that the second current threshold Ith2 is the second small-current-side threshold I2L (NO at step S14), the control unit 50 determines that the current state is the state in which the second switch SW2 is to be switched to the off-state. The control unit 50 then proceeds to step S25. At step S25, the control unit 50 determines whether or not the second drive signal IN2 is switched from the on-command to the off-command during the current control period.

When determined NO at step S25 (i.e., the second drive signal IN2 is not switched from the on-command to the off-command), the control unit 50 temporarily ends the series of processes. Meanwhile, when determined YES at step S25 (i.e., the second drive signal IN2 is switched from the on-command to the off-command), the control unit 50 proceeds to step S26. At step S26, the control unit 50 switches the second switch SW2 to the off-state by off-driving. In addition, the control unit 50 sets the second flag F2 to 0. The control unit 50 then temporarily ends the series of processes.

Figure 5:
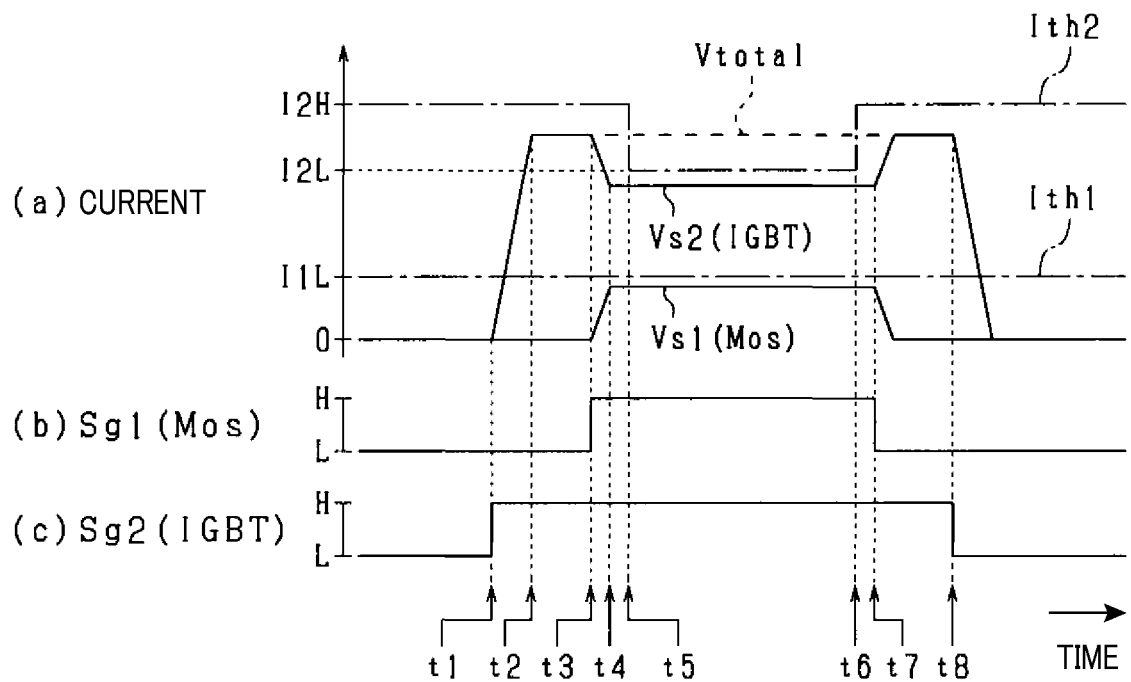
FIG. 5 is a timing chart of a threshold setting mode.

FIG. 5 shows a setting mode of the second current threshold Ith2. FIG. 5 shows, by (a), transitions of the first and second sense voltages Vs1 and Vs2 that correspond to currents, a total voltage Vtotal that is a total value of the sense voltages Vs1 and Vs2, and the first and second current thresholds Ith1 and Ith2. FIG. 5 shows, by (b), a transition of a first gate signal Sg1 that is a gate signal of the first switch SW1. FIG. 5 shows, by (c), a transition of a second gate signal Sg2 that is a gate signal of the second switch SW2.

The first gate signal Sg1 is L when the gate voltage of the first switch SW1 is lower than the first threshold voltage Vth1. The first gate signal Sg1 is H when the gate voltage of the first switch SW1 is equal to or higher than the first threshold voltage Vth1. The second gate signal Sg2 is L when the gate voltage of the second switch SW2 is lower than the second threshold voltage Vth2. The second gate signal Sg2 is H when the gate voltage of the second switch SW2 is equal to or higher than the second threshold voltage Vth2.

At time t1, the second gate signal Sg2 is switched to H. The second sense voltage Vs2 starts to increase. The second sense voltage Vs2 continues to increase until time t2. At time t3, the first gate signal Sg1 is switched to H. The first sense voltage Vs1 starts to increase. Meanwhile, because the drain current starts to flow to the first switch Sw1, the second sense voltage Vs2 starts to decrease. The increase in the first sense voltage Vs1 and the decrease in the second sense voltage Vs2 continue until time t4.

Subsequently, at time t5, the control unit 50 makes a YES determination at step S19 in FIG. 4. Therefore, the second current threshold Ith is switched from the second large-current-side threshold I2H to the second small-current-side threshold I2L. Then, at time t6, the control unit 50 makes a YES determination at step S21. Therefore, the second current threshold Ith2 is switched to the second large-current-side threshold I2H.

Subsequently, at time t7, the first gate signal Sg1 is switched to L. The first sense voltage Vs1 starts to decrease towards zero. In addition, the second sense voltage Vs2 starts to increase. When the first sense voltage Vs1 reaches zero, the increase in the second sense voltage Vs2 stops. Then, at time t8, the second gate signal Sg2 is switched to L. The second sense voltage Vs2 starts to decrease towards zero. According to the present embedment, the period from time t1 to time t3 and the period from time t7 to time t8 are shorter than the period from time t3 to time t7.

Figure 6:
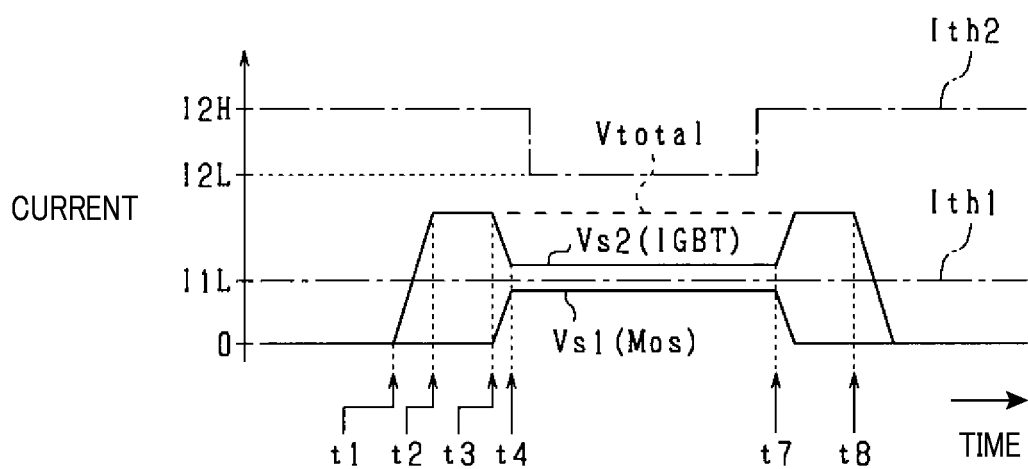
FIG. 6 is a timing chart of a threshold setting mode.
Figure 7:
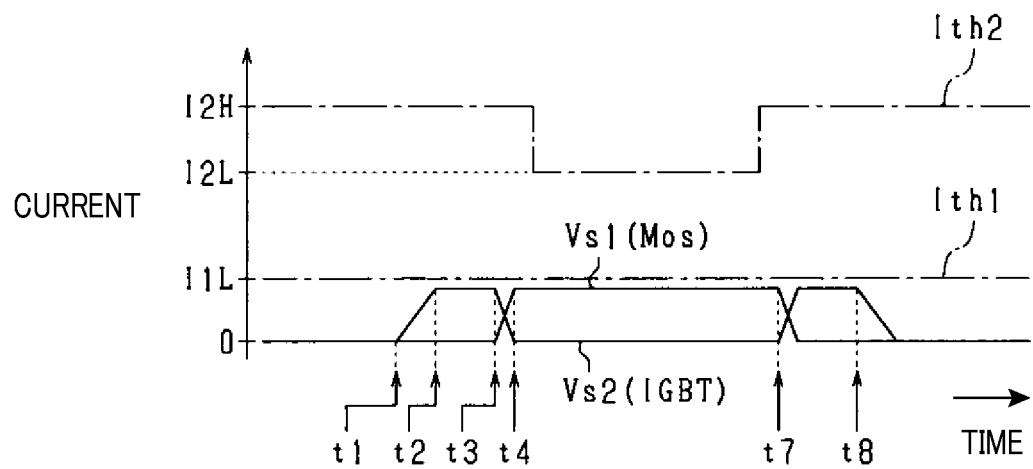
FIG. 7 is a timing chart of a threshold setting mode.

FIG. 6 shows an example in which the total voltage Vtotal is lower than that in FIG. 5. In addition, FIG. 7 shows an example in which the total voltage Vtotal is lower than that in FIG. 6. In the example shown in FIG. 7, the current corresponding to the total voltage Vtotal is included in the small-current region in FIG. 2. Therefore, in FIG. 7, the current flows to the first switch SW1 that has the lower on-resistance of the first and second switches SW1 and SW2.

Next, effects according to the present embodiment will be described in comparison with comparison examples.

First, the comparison examples will be described. A configuration in which the second current threshold Ith2 is fixed to the second large-current-side threshold I2H is a comparison example 1. In this case, during the period from time t4 to time t7 in FIG. 5, the second current threshold Ith2 is set to be greater in relation to the second sense voltage Vs2. As a result, for example, when an overcurrent flows to the second switch SW2 during the period from time T4 to time t7, the overcurrent state of the second switch SW2 cannot be promptly determined. The second overcurrent determining unit 52b may not be able to promptly switch the first and second switches SW1 and SW2 to the off-state.

Meanwhile, a configuration in which the second current threshold Ith2 is fixed to the second small-current-side threshold I2L is a comparison example 2. In this case, for example, during the period from time t1 to time t4 and the period from time t7 to time t8 in FIG. 5, the second current threshold Ith2 is set to be less in relation to the second sense voltage Vs2. As a result, regardless of the second switch SW2 not being in the overcurrent state, for example, the second sense voltage Vs2 may exceed the second current threshold Ith2 during the period from time t1 to time t4 and the period from time t7 to time t8 in FIG. 5. As a result, the second switch SW2 may be erroneously determined to be in the overcurrent state.

In this regard, according to the present embodiment, the second current threshold Ith2 during the on-driving period (the period from time t1 to time t3 and the period from time t7 to time t8 in FIG. 5) of only the second switch SW2, of the first and second switches SW1 and SW2, is set to be greater than the second current threshold Ith2 in at least the intermediate part (the period from time t5 to time t6 in FIG. 5) of the on-driving period (the period from time t3 to time t7 in FIG. 5) of both the first and second switches SW1 and SW2.

Therefore, the occurrence of an erroneous determination that the second switch SW2 is in the overcurrent state can be suppressed during the on-driving period of only the second switch SW2. At the same time, when the overcurrent state of the second switch SW2 occurs during the on-driving period of the first and second switches SW1 and SW2, the first and second switches SW1 and SW2 can be promptly switched to the off-state. In this way, according to the present embodiment, the second current threshold Ith2 can be appropriately set based on the driving states of the first and second switches SW1 and SW2.

Variation Example 1 According to the First Embodiment

According to the embodiments below, differences from the first embodiment will mainly be described. Configurations according to the embodiments below that are identical to those described according to the first embodiment are given the same reference numbers for convenience.

Figure 8:
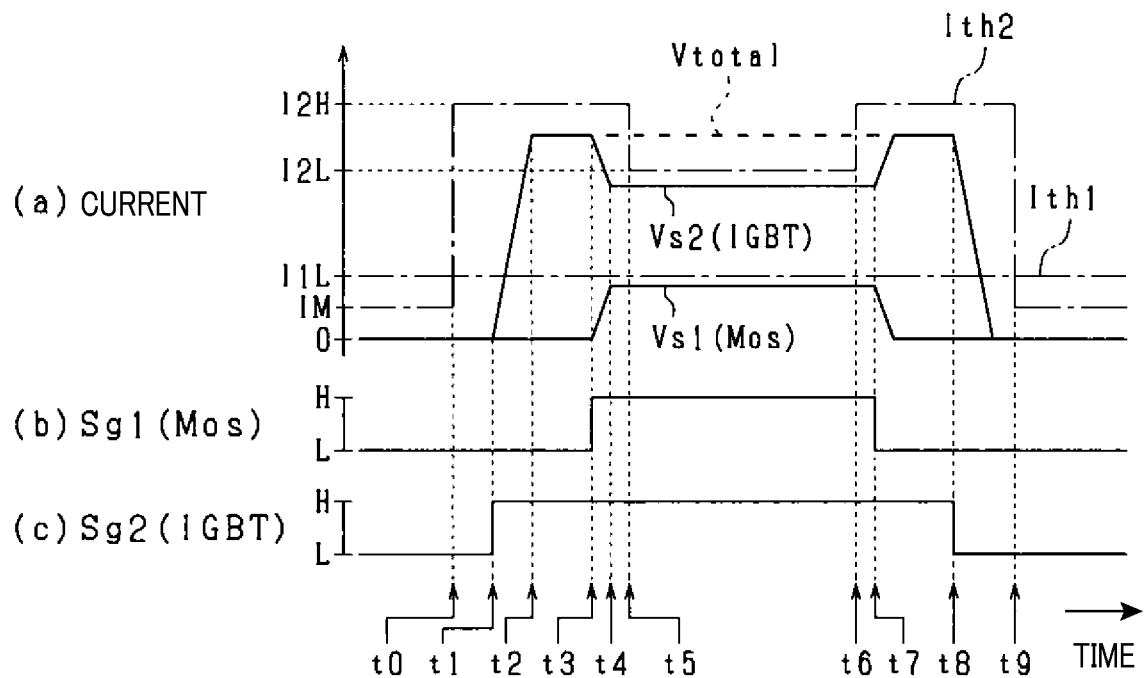
FIG. 8 is a timing chart of a threshold setting mode in a variation example 1 according to the first embodiment.

As shown in the period before time t0 and the period after time t9 in FIG. 8, the second current threshold Ith2 during the off-driving period of the first and second switches SW1 and SW2 may be set to an off-period threshold IM (>0) that is less than the second current threshold Ith2 during the on-driving period of only the second switch SW2. FIG. 8 shows an example in which the second current threshold Ith2 during the period before time t0 and the period after time t9 are set to the off-period threshold IM that is less than the first current threshold Ith1. The timings from time t1 to time t8 in FIG. 8 correspond to the timings from time t1 to time t8 in FIG. 5.

According to the present embodiment, the second current threshold Ith2 during the on-driving period of only the second switch SW2 is set to be greater than the second current threshold Ith2 at least the intermediate point of the on-driving period or the off-driving period of the first and second switches SW1 and SW2. As a result, for example, the overcurrent state of the second switch SW2 can be promptly determined during the period before time t0 and the period after time t9. The first and second switches SW1 and SW2 can be forcibly switched to the off-state.

Variation Example 2 According to the First Embodiment

Figure 9:
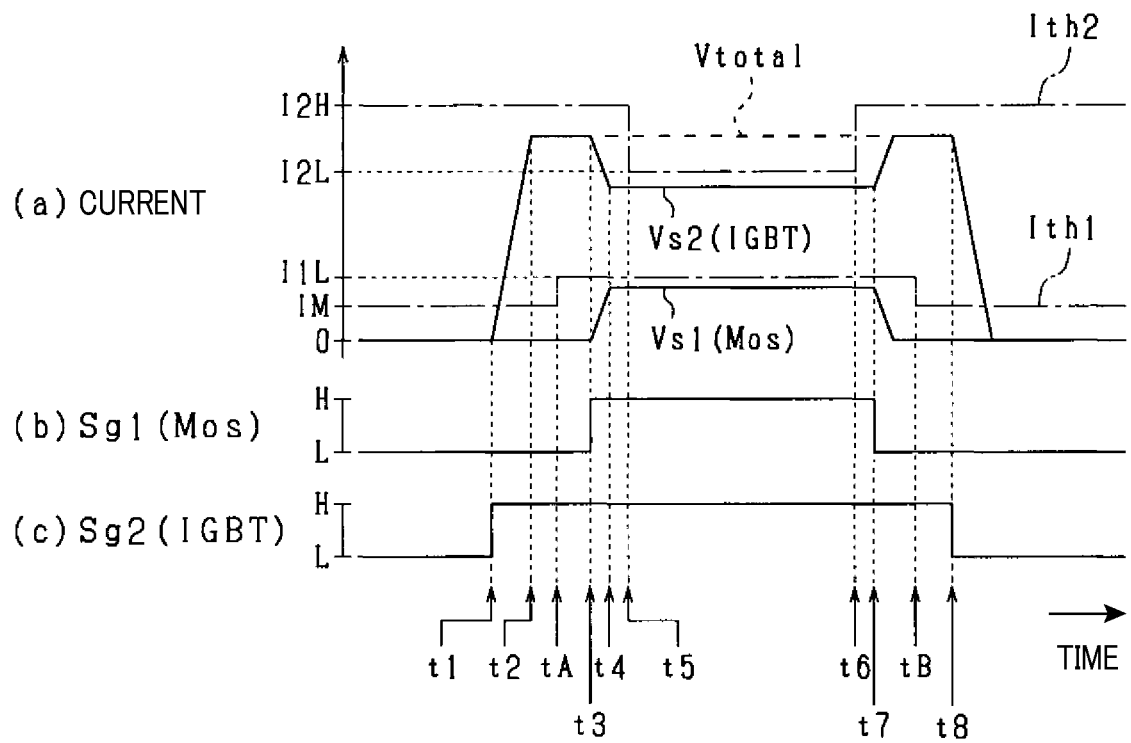
FIG. 9 is a timing chart of a threshold setting mode in a variation example 2 according to the first embodiment.

The first current threshold Ith1 may be changed in addition to the second current threshold Ith2. Specifically, as shown in FIG. 9, the first setting unit 53a may increase the first current threshold Ith1 from the off-period threshold IM to the first small-current-side threshold I1L time to that is after time t1 and before time t3. The timing at which the first current threshold Ith1 is increased to the first small-current-side threshold I1L is not limited to the timing after time t2 and, for example, may be between time t1 and time t2.

In addition, the first setting unit 53a may decrease the first current threshold Ith1 from the first small-current-side threshold I1L to the off-period threshold IM at a timing at which the first switch SW1 is switched to the off-state or a timing after this timing. FIG. 9 shows an example in which the first current threshold Ith1 is decreased to the off-period threshold IM at time tB that is after the timing at which the first switch SW1 is switched to the off-state.

Variation Example 3 According to the First Embodiment

In FIG. 5, described above, the second current threshold Ith2 is set to the second large-current-side threshold I2H over the overall on-driving period of only the second switch SW2, of the first and second switches SW1 and SW2. Instead of this setting, the second current threshold Ith2 may be set to the second large-current-side threshold I2H over a portion of the on-driving period of only the second switch SW2.

In this case, for example, time t2 or a timing between time t1 and time t2 in FIG. 5 can be given as the timing at which the second current threshold Ith2 is switched from the second large-current-side threshold I2H to the second small-current-side threshold I2L. For example, this setting is made in light of a likelihood that the current flowing to the second switch SW2 will spike during a brief period (such as several microseconds) immediately after the second switch SW2 is switched to the on-state at time t1 in FIG. 5.

Second Embodiment

A second embodiment will be described below with reference to the drawings, mainly focusing on the differences from the first embodiment. According to the present embodiment, the first and second driving units 51a and 51b perform an alternating-current (AC) assist process during turn-off instead of the DC assist process. In this assist process, in a state in which the first and second switches SW1 and SW2 are being on-driven, the second switch SW2 that corresponds to a preceding off-switch is first switched to off-driving. Subsequently, the first switch SW1 that corresponds to a following off-switch is switched to off-driving.

The AC assist process during turn-off is performed to reduce switching loss in cases in which a state in which a current is flowing to the parallel-connection body composed of the first and second switches SW1 and SW2 transitions to a state in which the flow of current is blocked. That is, according to the present embodiment, a switching speed of the first switch SW1 is set to be higher than the switching speed of the second switch SW2.

For example, when described using a turn-off period as an example, the switching speed refers to an amount of time required from when the gate voltage of the switch starts to decrease as a result of off-driving until the gate voltage becomes lower than a threshold voltage Vth. When the transition to the state in which the flow of current is blocked is made in the first switch SW1 that has the higher switching speed, an effect of reducing switching loss is achieved. According to the present embodiment, the first and second driving units 51a and 51b correspond to an AC off-driving unit.

According to the present embodiment, the second setting unit 53b fixes the second current threshold Ith2 to the second large-current-side threshold I2H. According to the present embodiment, the second large-current-side threshold I2H is set to a value that is equal to or greater than the rated current of the second switch SW2 and equal to or less than the withstand current of the second switch SW2.

Meanwhile, the first setting unit 53a increases the first current threshold Ith1 from the first small-current-side threshold I1L to the first large-current-side threshold I1H before the gate voltage of the second switch SW2 falls below the second threshold voltage Vth2 and the second switch SW2 is switched to the off-state after the second switch SW2 is switched to off-driving. According to the present embodiment, the first large-current-side threshold I1H is set to a value that is equal to or greater than the withstand current of the first switch SW1. Specifically, for example, the first large-current-side threshold I1H is set to the same value as the withstand current of the first switch SW1.

FIG. 10 shows the steps in a threshold setting process performed by the control unit 50. The control unit 50 repeatedly performs the process at a predetermined control period. The initial value of the first current threshold Ith1 is set to the first large-current-side threshold I1H.

In this series of processes, at step S30, the control unit 50 determines whether or not the second drive signal IN2 is switched from the off-command to the on-command during the current control period. When determined YES at step S30, the control unit 50 proceeds to step S31. The control unit 50 switches the second switch SW2 to the on-state by on-driving.

When determined NO at step S30 (i.e., the second drive signal IN2 is not switched from the off-command to the on-command), the control unit 50 proceeds to step S32. At step S32, the control unit 50 determines whether or not the first drive signal IN1 is switched from the off-command to the on-command during the current control period. When determined YES at step S32 (i.e., the second drive signal IN2 is switched from the off-command to the on-command), the control unit 50 proceeds to step S33. At step S33, the control unit 50 switches the first switch SW1 to the on-state by on-driving.

When determined NO at step S32 (i.e., the second drive signal IN2 is not switched from the off-command to the on-command), the control unit 50 proceeds to step S34. At step S34, the control unit 50 determines whether or not the second drive signal IN2 is switched from the on-command to the off-command during the current control period. When determined YES at step S34 (i.e., the second drive signal IN2 is switched from the on-command to the off-command), the control unit 50 proceeds to step S35. At step S35, the control unit 50 switches the second switch SW2 to the off-state by off-driving. Subsequently, at step S36, the control unit 50 starts to count a first elapsed time Tdelay1.

When determined NO at step S34 (i.e., the second drive signal IN2 is not switched from the on-command to the off-command), the control unit 50 proceeds to step S37. At step S37, the control unit 50 determines whether or not the first drive signal IN1 is switched from the on-command to the off-command during the current control period. When determined YES at step S37 (i.e., the first drive signal IN1 is switched from the on-command to the off-command), the control unit 50 proceeds to step S38. At step S38, the control unit 50 switches the first switch SW1 to the off-state by off-driving. Subsequently, at step S39, the control unit 50 starts to count a second elapsed time Tdelay2.

When determined NO at step S37 (i.e., the first drive signal IN1 is not switched from the on-command to the off-command), the control unit 50 proceeds to step S40. At step S40, the control unit 50 determines whether or not the first elapsed time Tdelay1 is equal to or greater than a first delay time Ts1. The control unit 50 performs the process at step S40 to determine whether or not the current timing is a timing at which the first current threshold Ith1 is to be increased. For example, the first delay time Ts1 may be set to an amount of time that is shorter than the amount of time from the timing at which the second switch SW2 is off-driven at step S35 until the timing at which the gate voltage of the second switch SW2 decreases and falls below the second threshold voltage Vth2.

When determined YES at step S40 (i.e., the first elapsed time Tdelay1 is equal to or greater than a first delay time Ts1), the control unit 50 proceeds to step S41. At step S41, the control unit 50 sets the first current threshold Ith1 to the first large-current-side threshold I1H. According to the present embodiment, the first large-current-side threshold I1H is greater than the second large-current-side threshold I2H. In addition, the first elapsed time Tdelay1 is reset to zero.

When determined NO at step S40 (i.e., the first elapsed time Tdelay1 is less than a first delay time Ts1), the control unit 50 proceeds to step S42. At step S42, the control unit 50 determines whether or not a second elapsed time Tdelay2 is equal to or greater than a second delay time Ts2. The control unit 50 performs the process at step S42 to determine whether or not the current timing is a timing at which the first current threshold Ith1 is to be decreased. For example, the second delay time Tdelay2 may be set to an amount of time at which the gate voltage of the first switch SW1 decreasing and falling below the first threshold voltage Vth1 after the first switch SW1 is off-driven at step S38 can be detected.

When determined YES at step S42 (i.e., the second elapsed time Tdelay2 is equal to or greater than a second delay time Ts2), the control unit 50 proceeds to step S43. At step S43, the control unit 50 switches the first current threshold Ith1 to the first small-current-side threshold I1L. In addition, the control unit 50 resets the second elapsed time Tdelay2 to zero.

FIG. 11 shows a setting mode of the first current threshold Ith1. FIG. 11 shows, by (a), the transitions of the first and second sense voltages Vs1 and Vs2, the total voltage Vtotal, and the first and second current thresholds Ith1 and Ith2. FIG. 11 shows, by (b) and (c), the transitions of the first and second drive signals IN1 and IN2.

At time t1, the second drive signal IN2 is switched to the on-command before the first drive signal IN1. As a result, the second sense voltage Vs2 of the second switch SW2 that is subsequently in the on-state starts to increase. At time t2, the first drive signal IN1 is switched to the on-command. The first sense voltage Vs1 of the first switch SW1 that is subsequently in the on-state starts to increase. At this time, the second sense voltage Vs2 decreases as the first sense voltage Vs1 increases.

At time t3, the second drive signal IN2 is switched to the off-command before the first drive signal IN1. Subsequently, at time t4 before the second sense voltage Vs2 starts to decrease, the control unit 50 makes a YES determination at step S40 in FIG. 9. Therefore, the first current threshold Ith1 is switched from the first small-current-side threshold I1L to the first large-current-side threshold I1H.

At time t5, the first drive signal IN1 is switched to the off-command. Subsequently, at time t6, the control unit 50 makes a YES determination at step S42. Therefore, the first current threshold Ith1 is switched to the first small-current-side threshold I1L. As a result, an overcurrent state can be promptly determined during the off-driving period of the first and second switches SW1 and SW2.

According to the present embodiment described above, the first current threshold Ith1 is increased from the first small-current-side threshold I1L to the first large-current-side threshold I1H with reference to the timing at which the second drive signal IN2 is switched to the off-command. The control unit 50 can more quickly ascertain the timing at which the second drive signal IN2 is switched to the off-command, than the timing at the second gate signal Sg2 is switched to L. Therefore, the first current threshold Ith1 can be accurately increased before the second switch SW2 is set to the off-state before the first switch SW1 and the current becomes concentrated at the first switch SW1.

Variation Example 1 According to the Second Embodiment

In FIG. 11, described above, the first current threshold Ith1 is set to the first large-current-side threshold I1H over the overall on-driving period of only the first switch SW1, of the first and second switches SW1 and SW2. Instead of this setting, the first current threshold Ith1 may be set to the first large-current-side threshold I1H over a portion of the on-driving period of only the first switch SW1.

Variation Example 2 According to the Second Embodiment

As shown in FIG. 12, the second current threshold Ith2 may be changed in addition to the first current threshold Ith1. In FIG. 12, (a) to (c) respectively correspond to (a) to (c) in FIG. 11, described above.

Specifically, the second setting unit 53b decreases the second current threshold Ith2 from the second large-current-side threshold I2H to the off-period threshold IM after the second switch SW2 is switched to the off state. In addition, the second setting unit 53b increases the second current threshold Ith2 from the off-period threshold IM to the second large-current-side threshold I2H before the second switch SW2 is switched to the on-state.

In the large-current region shown in FIG. 2, described above, the current is concentrated at the second switch SW2 that has a lower on-resistance than the first switch SW1. Therefore, in the large-current region, the amount of increase in the collector current of the second switch SW2 when switched from the off-state to the on-state is large. Consequently, changing the second current threshold Ith2 as shown in FIG. 12A to FIG. 12C is highly advantageous.

In addition, as shown in FIG. 12, the setting mode of the first current threshold Ith1 may be changed. Specifically, at time 6, the first setting unit 53a decreases the first current threshold Ith1 from the first large-current-side threshold I1H to the off-period threshold IM. In addition, the first setting unit 53a increases the first current threshold Ith1 from the off-period threshold IM to the first small-current-side threshold I1L before the first switch SW1 is switched to the on-state.

Third Embodiment

A third embodiment will be described below with reference to the drawings, mainly focusing on the differences from the second embodiment. According to the present embodiment, the first setting unit 53a increases the first current threshold Ith1 at the timing at which the second switch SW2 is switched to the off-state.

Figure 13:
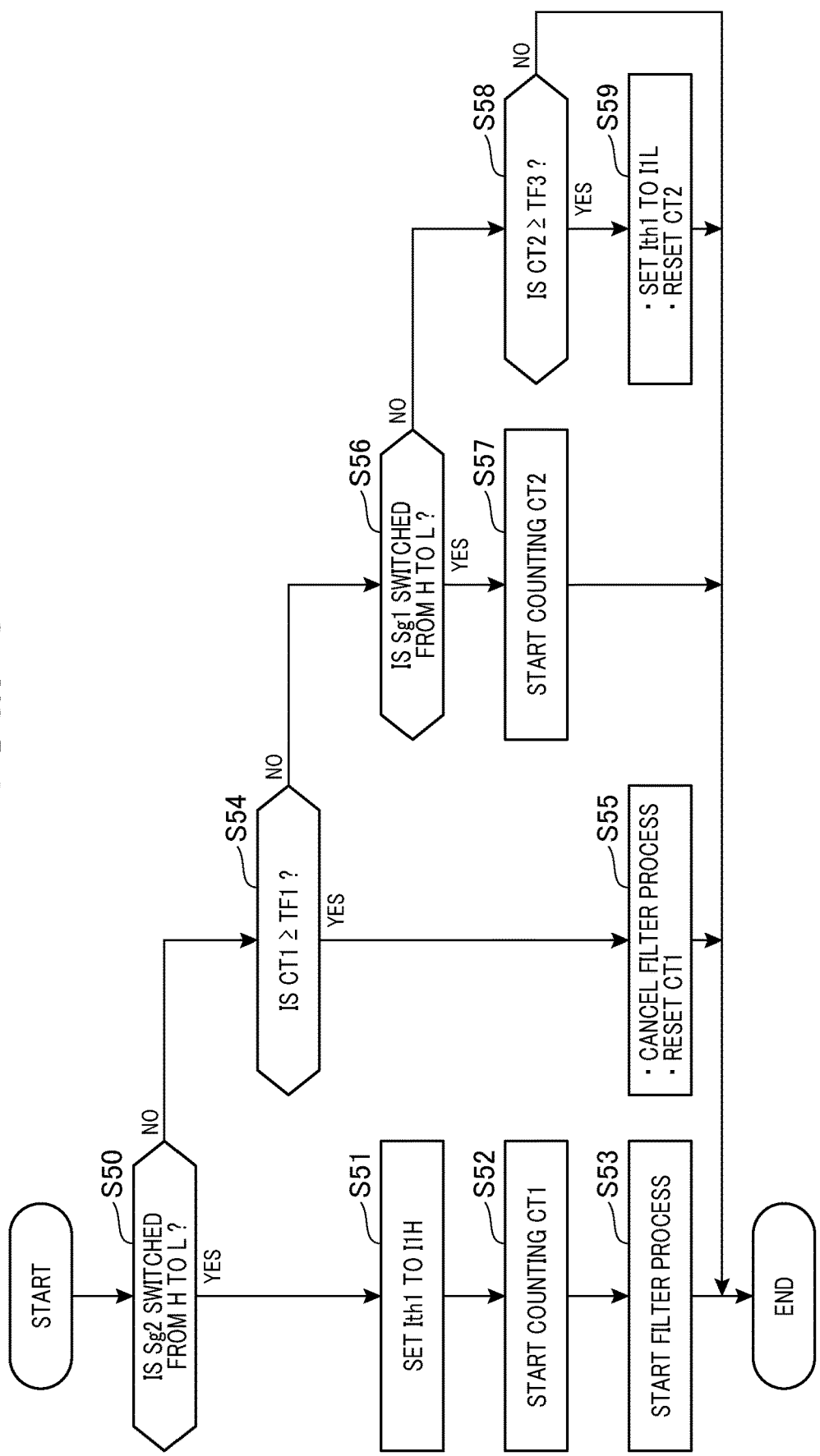
FIG. 13 is a flowchart of the steps in a threshold setting process according to a third embodiment.

FIG. 13 shows the steps in a threshold setting process performed by the control unit 50. The control unit 50 repeatedly performs the process at a predetermined control period. The initial value of the first current threshold Ith1 is set to the first large-current-side threshold I1H.

In this series of processes, at step S50, the control unit 50 determines whether or not the second gate signal Sg2 is switched from H to L during the current control period. When determined YES at step S50 (i.e., the second gate signal Sg2 is switched from H to L), the control unit 50 proceeds to step S51. At step S51, the control unit 50 switches the first current threshold Ith1 to the first large-current-side threshold I1H. Subsequently, at step S52, the control unit 50 starts to count a first elapsed time CT1.

At step S53, the control unit 50 starts a filter process that prevents the first overcurrent determining unit 52a from using the first sense voltage Vs1. During the filter process, the first and second switches SW1 and SW2 are not forcibly switched to the off-state even should the first sense voltage Vs1 exceed the first current threshold Ith1. Processes from the start of the filter process at step S53 until the subsequent cancellation of the filter process at step S55 correspond to a filter unit.

When determined NO at step S50 (i.e., the second gate signal Sg2 is not switched from H to L), the control unit 50 proceeds to step S54. At step S54, the control unit 50 determines whether or not the first elapsed time CT1 is equal to or greater than a first filter time TF1. When determined YES at step S54 (i.e., the first elapsed time CT1 is equal to or greater than a first filter time TF1), the control unit 50 proceeds to step S55.

At step S55, the control unit 50 cancels the filter process. In addition, the control unit 55 resets the first elapsed time CT1 to zero. For example, the first filter time TF1 may be set to an amount of time that is shorter than the amount of time from the timing at which the second gate signal Sg2 is switched to L until the timing immediately thereafter at which the first gate signal Sg1 is switched to L.

When determined NO at step S54 (i.e., the first elapsed time CT1 is less than a first filter time TF1), the control unit 50 proceeds to step S56. The control unit 50 determines whether or not the first gate signal Sg1 is switched from H to L during the current control period. When determined YES at step S56 (i.e., the first gate signal Sg1 is switched from H to L), the control unit 50 proceeds to step S57. At step S57, the control unit 50 starts to count a second elapsed time CT2.

When determined NO at step S56 (i.e., the first gate signal Sg1 is not switched from H to L), the control unit 50 proceeds to step S58. At step S58, the control unit 50 determines whether or not the second elapsed time CT2 is equal to or greater than a third delay time Ts3. For example, the third delay time Ts3 may be set to an amount of time at which the gate voltage of the first switch SW1 decreasing and falling below the first threshold voltage Vth1 after the first switch SW1 is off-driven can be detected.

When determined YES at step S58 (i.e., the second elapsed time CT2 is equal to or greater than a third delay time Ts3), the control unit 50 proceeds to step S59. At step S59, the control unit 50 switches the first current threshold Ith1 to the first small-current-side threshold I1L. In addition, the control unit 50 resets the second elapsed time CT2 to zero.

Figure 14:
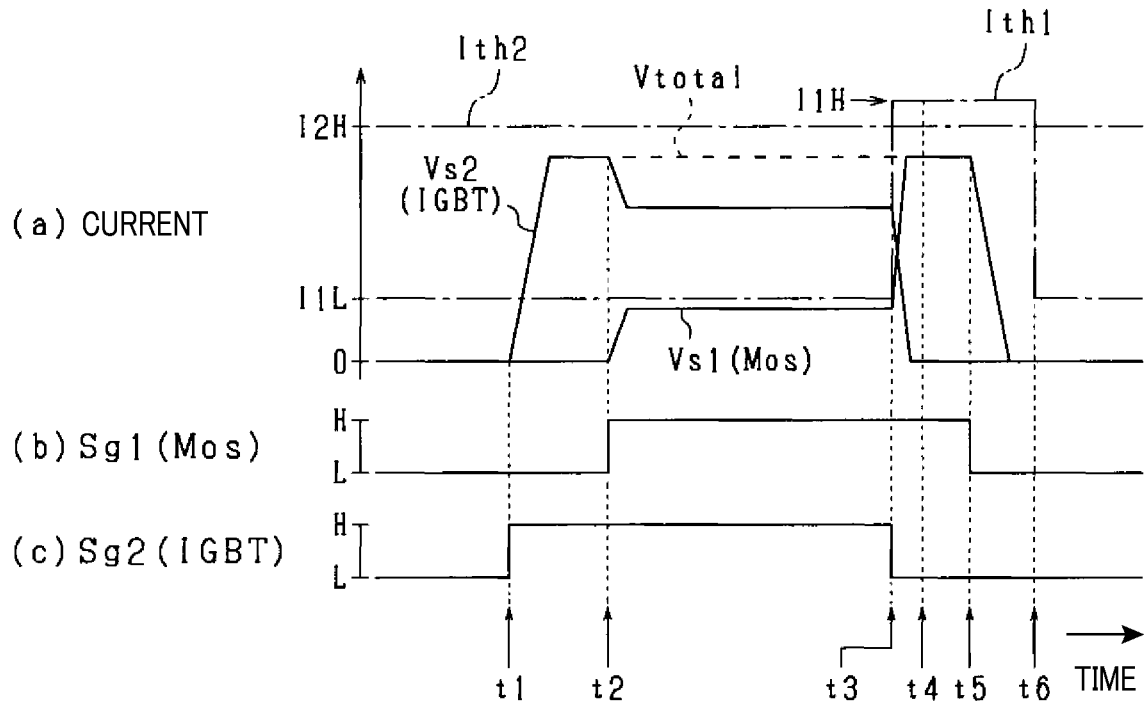
FIG. 14 is a timing chart of a threshold setting mode.

FIG. 14 shows a setting mode of the first current threshold Ith1. FIG. 14 shows, by (a), the transitions of the first and second sense voltages Vs1 and Vs2, the total voltage Vtotal, and the first and second current thresholds Ith1 and Ith2. FIG. 14 shows, by (b) and (c), the transitions of the first and second gate signals Sg1 and Sg2.

At time t1, the second gate signal Sg2 is switched to H. Subsequently, the first gate signal Sg1 is switched to H. Then, at time t3, the second gate signal Sg2 is switched to L. The control unit 50 makes a YES determination at step S50 in FIG. 13. Therefore, the first current threshold Ith1 is switched from the first small-current-side threshold I1L to the first large-current-side threshold I1H. In addition, the filter process is started.

Because the control unit 50 makes a YES determination at step S54 (i.e., the first elapsed time CT1 is equal to or greater than a first filter time TF1), at time t4, the filter process is canceled. Then, at time t5, the first gate signal Sg1 is switched to L. At time t6, the control unit 50 makes a YES determination at step S58 (i.e., the second elapsed time CT2 is equal to or greater than a third delay time Ts3). Therefore, the first current threshold Ith1 is switched to the first small-current-side threshold I1L.

According to the present embodiment described above, the first current threshold Ith1 is increased at the timing at which the second switch SW2 is switched to the off-state. In addition, the filter process is performed over the first filter time TF1 from when the second switch SW2 is switched to the off-state, during the period in which only the first switch SW1 is on-driven. As a result, effects similar to those according to the first embodiment can be achieved.

Variation Example 1 According to the Third Embodiment

In FIG. 14, described above, the first current threshold Ith1 is set to the first large-current-side threshold I1H over the overall on-driving period of only the first switch SW1, of the first and second switches SW1 and SW2. Instead of this setting, the first current threshold Ith1 may be to the first large-current-side threshold I1H during a portion of the on-driving period of only the first switch SW1.

Variation Example 2 According to the Third Embodiment

Figure 15:
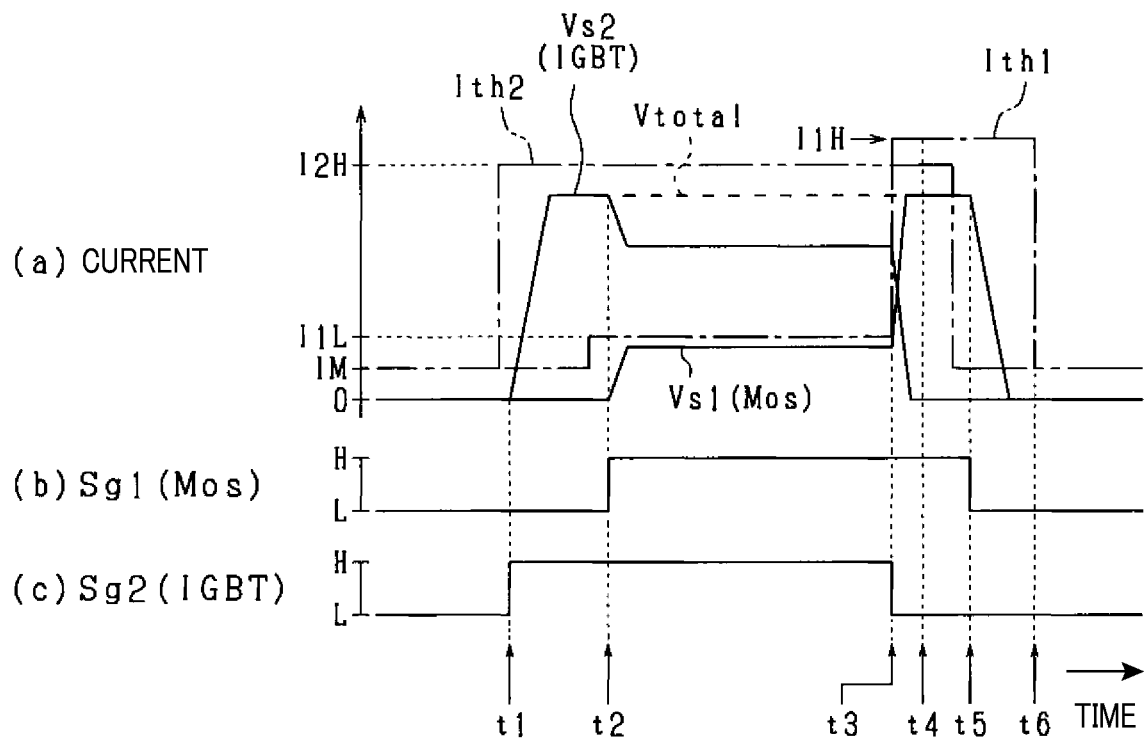
FIG. 15 is a timing chart of a threshold setting mode in a variation example 2 according to the third embodiment.

As shown in FIG. 15, the second current threshold Ith2 may be changed in addition to the first current threshold Ith1, in a manner similar to that in FIG. 12, described above. In FIG. 15, (a) to (c) respectively correspond to (a) to (c) in FIG. 14, described above.

In addition, as shown in FIG. 15, the setting mode of the first current threshold Ith1 may be changed in a manner similar to that in FIG. 12, described above.

Fourth Embodiment

Figure 16:
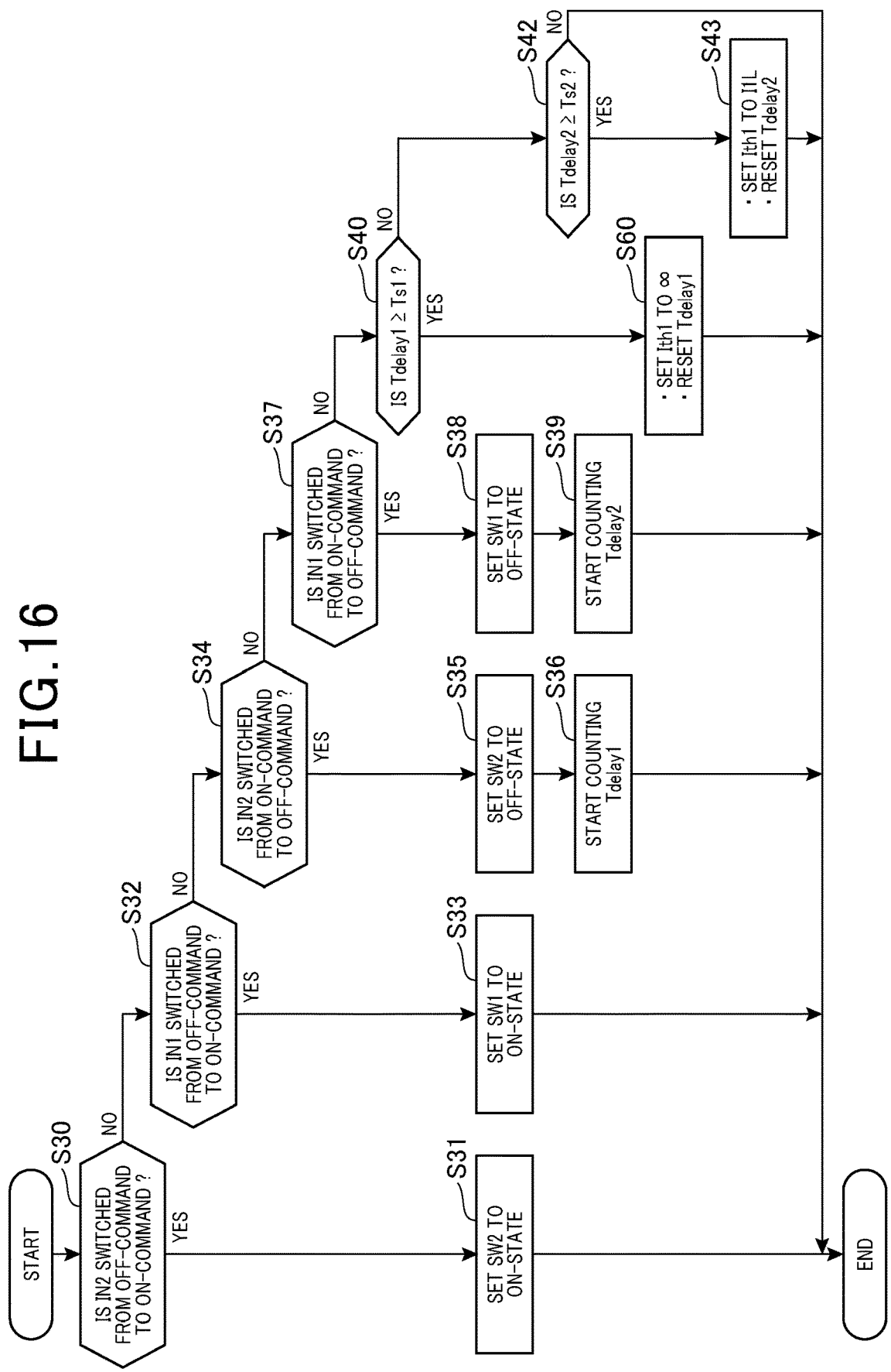
FIG. 16 is a flowchart of the steps in a threshold setting process according to a fourth embodiment.

A fourth embodiment will be described below with reference to the drawings, mainly focusing on the differences from the second embodiment. According to the present embodiment, instead of the process at step S41 in FIG. 10, the first current threshold Ith1 is increased to a value that is greater than a value that is assumed as a maximum value of the first sense voltage Vs1, as shown at step S60 in FIG. 16.

Specifically, for example, the first current threshold Ith1 is increased to a value that is greater than the maximum value of the first sense voltage Vs1 that can be inputted to the control unit 50. Processes in FIG. 16 that are identical to those shown in FIG. 10, described above, are given the same reference numbers for convenience.

Figure 17:
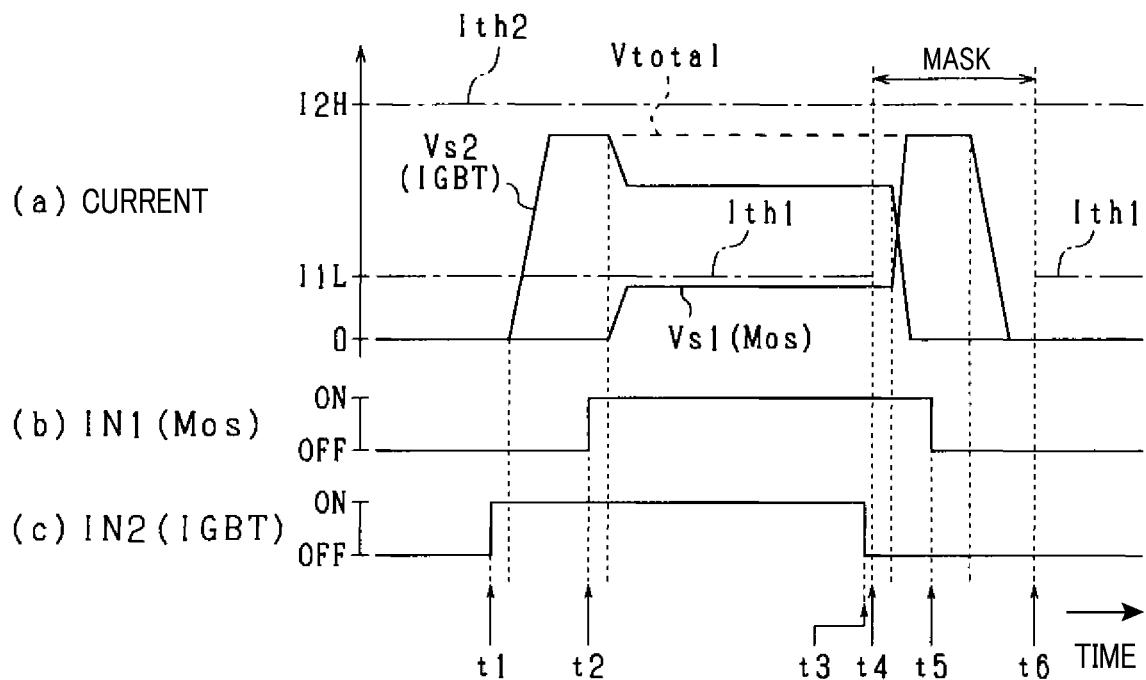
FIG. 17 is a timing chart of a threshold setting mode.

FIG. 17 shows a setting mode of the first current threshold Ith1. In FIG. 17, (a) to (c) respectively correspond to (a) to (c) in FIG. 11, described above. As shown in FIG. 17, the first current threshold Ith1 is increased to a value that does not intersect with the first sense voltage Vs1 during a mask period from time t4 to time t6. According to the present embodiment described above, effects similar to those according to the third embodiment can be achieved.

Variation Example According to the Fourth Embodiment

The second current threshold Ith2 may be changed in addition to the first current threshold Ith1, in a manner similar to that in FIG. 12, described above. In addition, regarding the first current threshold Ith1, the first small-current-side threshold I1L may be set to the off-period threshold IM.

Fifth Embodiment

A fifth embodiment will be described below with reference to the drawings, mainly focusing on the differences from the second embodiment. According to the present embodiment, the first and second drive units 51a and 51b perform an AC assist process during turn-on instead of the AC assist process during turn-off. In this assist process, in a state in which the first and second switches SW1 and SW2 are being off-driven, the first switch SW1 that corresponds to a preceding on-switch is first switched to on-driving. Subsequently, the second switch SW2 that corresponds to a following on-switch is switched to on-driving.

The AC assist process during turn-on is performed to reduce switching loss in cases in which a state in which the flow of current to the parallel-connection body composed of the first and second switches SW1 and SW2 is blocked transitions to a state in which the current is flowing. According to the second embodiment, in a manner similar to that according to the second embodiment, the switching speed of the first switch SW1 is set to be higher than the switching speed of the second switch SW2.

For example, when described using a turn-on period as an example, the switching speed refers to an amount of time required from when the gate voltage of the switch starts to increase from zero as a result of on-driving until the gate voltage reaches the threshold voltage Vth. According to the present embodiment, the first and second driving units 51a and 51b correspond to an AC on-driving unit.

The first setting unit 53a decreases the first current threshold Ith1 that serves as a target threshold from the first large-current-side threshold I1H to the first small-current-side threshold I1L after the gate voltage of the second switch SW2 becomes equal to or higher than the second threshold voltage Vth2 and the second switch SW2 is switched to the on-state after the second switch SW2 is switched to on-driving.

Figure 18:
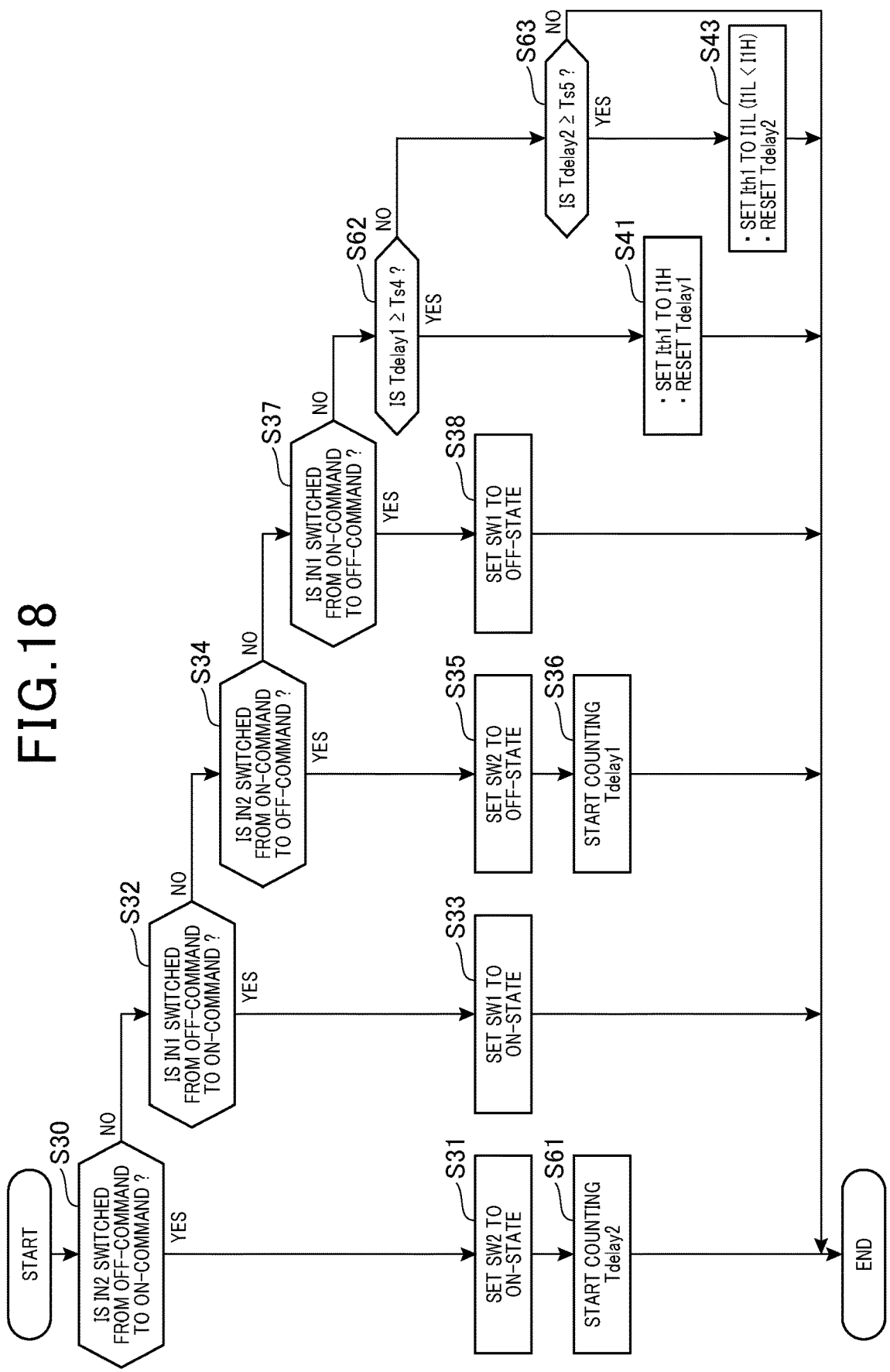
FIG. 18 is a flowchart of the steps in a threshold setting process according to a fifth embodiment.

FIG. 18 shows the steps in a threshold setting process performed by the control unit 50. The control unit 50 repeatedly performs the process at a predetermined control period. Processes in FIG. 18 that are identical to those shown in FIG. 10, described above, are given the same reference numbers for convenience.

Upon completion of the process at step S31, the control unit 50 proceeds to step S61. At step S61, the control unit 50 starts to count the second elapsed time Tdelay2. Upon completion of the process at step S61, the control unit 50 temporarily ends the series of processes.

When determined NO at step S37 (i.e., the first drive signal IN1 is not switched from the on-command to the off-command), the control unit 50 proceeds to step S62. At step S62, the control unit 50 determines whether or not the first elapsed time Tdelay1 is equal to or greater than a fourth delay time Ts4. When determined YES at step S62 (i.e., the first elapsed time Tdelay1 is equal to or greater than a fourth delay time Ts4), the control unit 50 proceeds to step S41.

When determined NO at step S62 (i.e., the first elapsed time Tdelay1 is less than a fourth delay time Ts4), the control unit 50 proceeds to step S63. At step S63, the control unit 50 determines whether or not the second elapsed time Tdelay2 is equal to or greater than a fifth delay time Ts5. When determined YES at step S63 (i.e., the second elapsed time Tdelay2 is equal to or greater than a fifth delay time Ts5), the control unit 50 proceeds to step S43.

Figure 19:
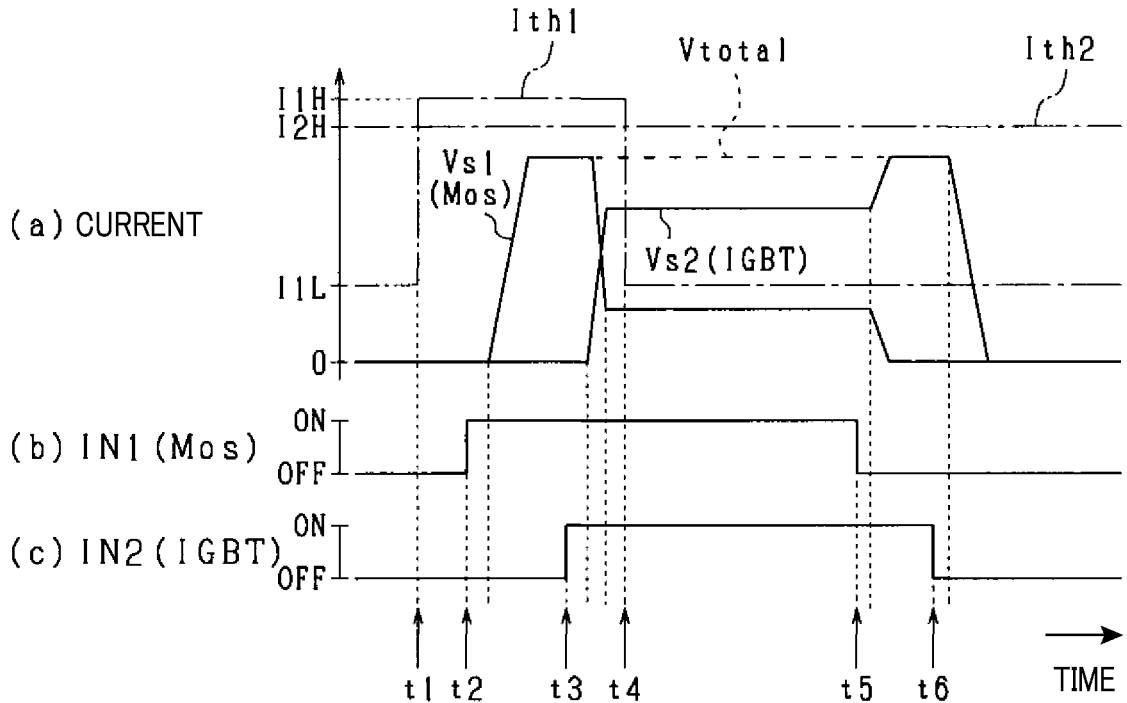
FIG. 19 is a timing chart of a threshold setting mode.

FIG. 19 shows a setting mode of the first current threshold Ith1. In FIG. 19, (a) to (c) respectively correspond to (a) to (c) in FIG. 11, described above.

At time t1, the control unit 50 makes a YES determination at step S63 in FIG. 18. Therefore, the first current threshold Ith1 is switched from the first small-current-side threshold I1L to the first large-current-side threshold I1H. Subsequently, at time t2, the first drive signal IN1 is switched to the on-command.

At time t3, the second drive signal IN2 is switched to the on-command. Therefore, counting of the second elapsed time Tdelay2 is started. Then, at time t4, the control unit 50 makes a YES determination at step S63. Therefore, the first current threshold Ith1 is switched from the first large-current-side threshold I1H to the first small-current-side threshold I1L.

Subsequently, at time t5, the first drive signal IN1 is switched to the off-command. Then, at time t6, the second drive signal IN2 is switched to the off-command. Therefore, counting of the first elapsed time Tdelay1 is started.

According to the present embodiment described above, effects similar to those according to the second embodiment can be achieved.

Variation Example 1 According to the Fifth Embodiment

In FIG. 19, described above, the first current threshold Ith1 is set to the first large-current-side threshold I1H over the overall on-driving period of only the first switch SW1, of the first and second switches SW1 and SW2. Instead of this setting, the first current threshold Ith1 may be set to the first large-current-side threshold I1H over a portion of the on-driving period of only the first switch SW1.

In this case, for example, as the timing at which the first current threshold Ith1 is switched from the first large-current-side threshold I1H to the first small-current-side threshold I1L, a timing during a period from the timing at which the first sense voltage Vs1 starts to increase from zero until the timing at which the first sense voltage Vs1 reaches the total voltage Vtotal, or the timing at which the first sense voltage Vs1 reaches the total voltage Vtotal can be given.

Variation Example 2 According to the Fifth Embodiment

Figure 20:
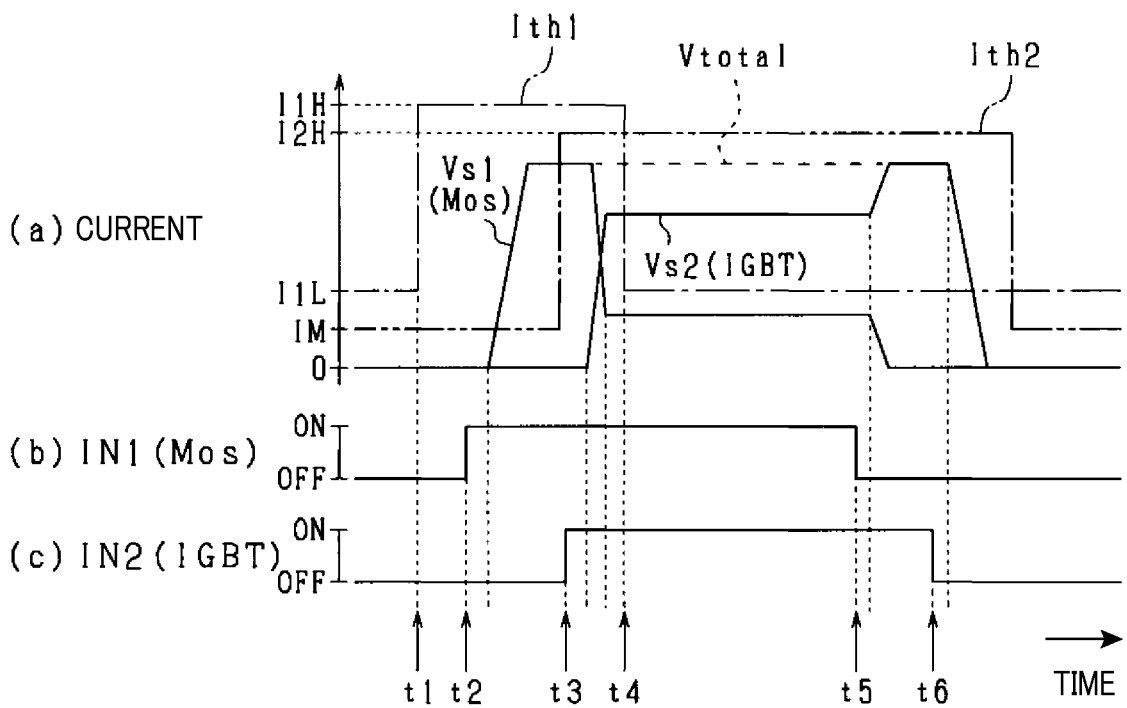
FIG. 20 is a timing chart of a threshold setting mode in a variation example 2 according to the fifth embodiment.

As shown in FIG. 20, the second current threshold Ith2 may be changed in addition to the first current threshold Ith1. In FIG. 20, (a) to (c) respectively correspond to (a) to (c) in FIG. 19, described above.

Specifically, the second setting unit 53b increases the second current threshold Ith2 from the off-period threshold IM to the second large-current-side threshold I2H before the second switch SW2 is switched to the on-state.

In addition, the second setting unit 53b decreases the second current threshold Ith2 from the second large-current-side threshold I2H to the off-period threshold IM subsequent to the timing at which the second switch SW2 is switched to the off-state and the second sense voltage Vs2 becomes zero. In this case, in the large-current region, the amount of increase in the collector current of the second switch SW2 when switched from the off-state to the on-state is large. Consequently, changing the second current threshold Ith2 as shown in FIG. 20, (a) to (c) is highly advantageous.

In addition, regarding the first current threshold Ith1, the first small-current-side threshold I1L may be set to the off-period threshold IM.

Sixth Embodiment

A sixth embodiment will be described below with reference to the drawings, mainly focusing on the differences from the fifth embodiment. According to the present embodiment, the first setting unit 53a decreases the first current threshold Ith1 at the timing at which the second switch SW2 is switched to the on-state.

Figure 21:
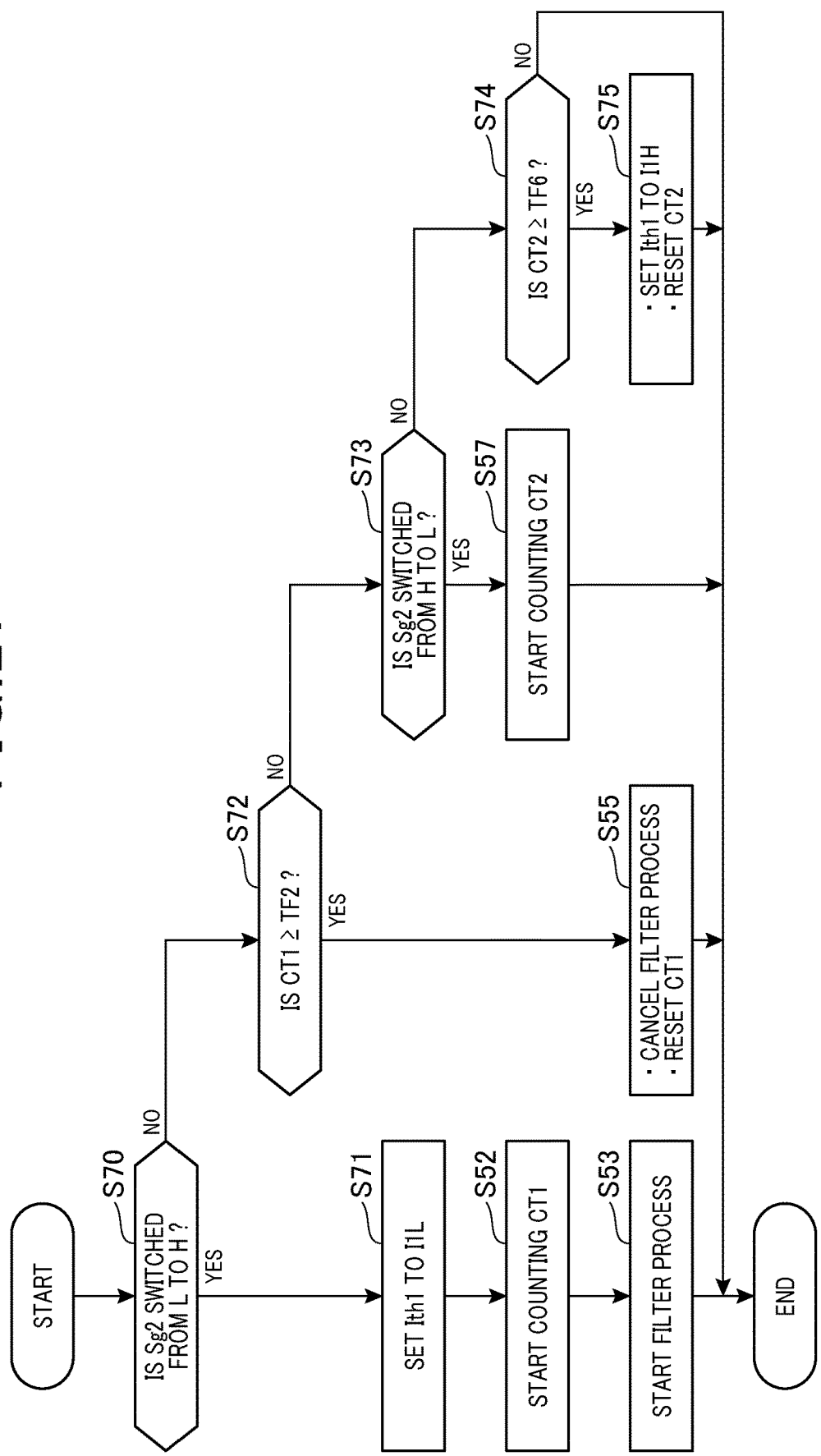
FIG. 21 is a flowchart of the steps in a threshold setting process according to a sixth embodiment.

FIG. 21 shows the steps in a threshold setting process performed by the control unit 50. The control unit 50 repeatedly performs the process at a predetermined control period. Processes in FIG. 21 that are identical to those shown in FIG. 13, described above, are given the same reference numbers for convenience.

In the series of processes, at step S70, the control unit 50 determines whether or not the second gate signal Sg2 is switched from L to H during the current control period. When determined YES at step S70 (i.e., the second gate signal Sg2 is switched from L to H), the control unit 50 proceeds to step S71. At step S71, the control unit 50 switches the first current threshold Ith1 to the first small-current-side threshold I1L. Then, the control unit 50 proceeds to step S52.

When determined NO at step S70 (i.e., the second gate signal Sg2 is not switched from L to H), the control unit 50 proceeds to step S72. At step S72, the control unit 50 determines whether or not the first elapsed time CT1 is equal to or greater than a second filter time TF2.

When determined YES at step S72 (i.e., the first elapsed time CT1 is equal to or greater than a second filter time TF2), the control unit 50 proceeds to step S55. At step S55, the control unit 50 cancels the filter process. In addition, the control unit 50 resets the first elapsed time CT1 to zero. For example, the second filter time TF2 may be set to an amount of time that is shorter than the amount of time from the timing at which the second gate signal Sg2 is switched to H until the timing immediately thereafter at which the first gate signal Sg1 is switched to L.

When determined NO at step S72 (i.e., the first elapsed time CT1 is less than a second filter time TF2), the control unit 50 proceeds to step S73. At step S73, the control unit 50 determines whether or not the second gate signal Sg2 is switched from H to L during the current control period. When determined YES at step S73 (i.e., the second gate signal Sg2 is switched from H to L), the control unit 50 proceeds to step S57.

When determined NO at step S73 (i.e., the second gate signal Sg2 is not switched from H to L), the control unit 50 proceeds to step S74. At step S74, the control unit 50 determines whether or not the second elapsed time CT2 is equal to or greater than a sixth delay time Ts6. When determined YES at step S74 (i.e., the second elapsed time CT2 is equal to or greater than a sixth delay time Ts6), the control unit 50 proceeds to step S75. At step S75, the control unit 50 switches the first current threshold Ith1 to the first large-current-side threshold I1H. In addition, the control unit 50 resets the second elapsed time CT2 to zero.

Figure 22:
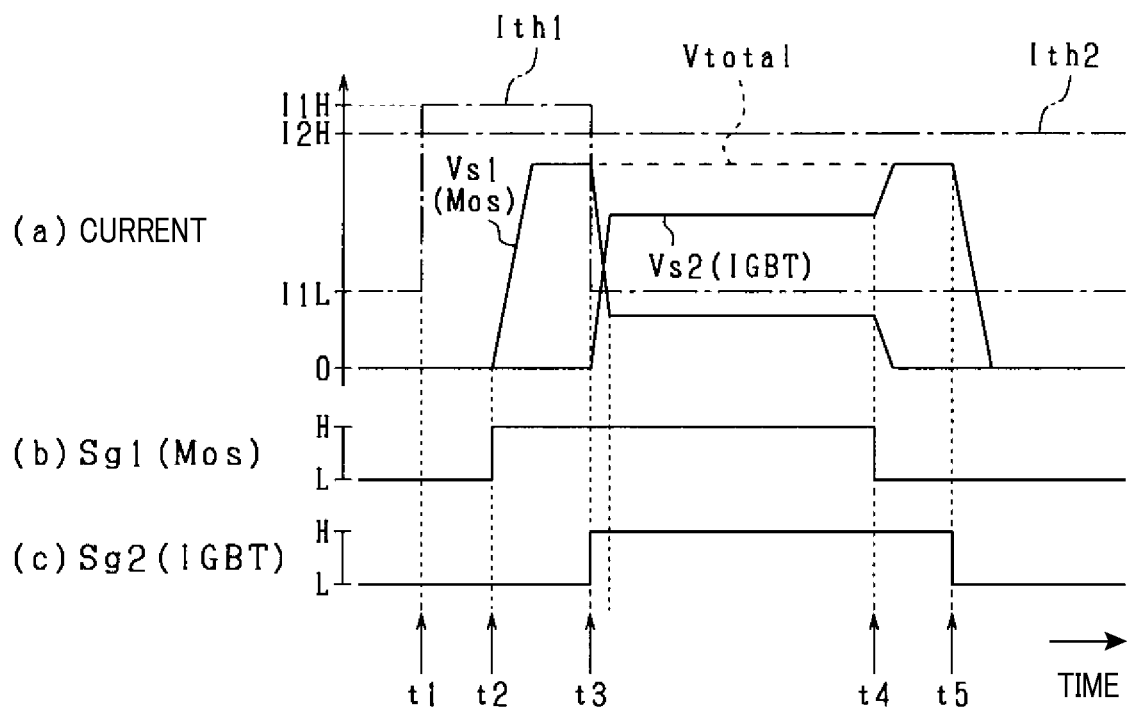
FIG. 22 is a timing chart of a threshold setting mode.

FIG. 22 shows a setting mode of the first current threshold Ith1. In FIG. 22, (a) to (c) respectively correspond to (a) to (c) in FIG. 14, described above.

At time t1, the control unit 50 makes a YES determination at step S74 (i.e., the second elapsed time CT2 is equal to or greater than a sixth delay time Ts6) in FIG. 21. Therefore, the first current threshold Ith1 is switched from the first small-current-side threshold I1L to the first large-current-side threshold I1H. Then, at time t2, the first gate signal Sg1 is switched to H.

At time t3, the second gate signal Sg2 is switched to H. Therefore, the control unit 50 makes a YES determination at step S70 (i.e., the second gate signal Sg2 is switched from L to H). The first current threshold Ith1 is switched from the first large-current-side threshold I1H to the first small-current-side threshold I1L. In addition, counting of the first elapsed time Tdelay1 and the filter process are started.

At time 4, the first gate signal Sg1 is switched to L. Then, at time t5, the second gate signal Sg2 is switched to L. Therefore, the control unit 50 makes a YES determination at step S73 (i.e., the second gate signal Sg2 is switched from H to L). Counting of the second elapsed time Tdelay2 is started.

According to the present embodiment described above, the first current threshold Ith1 is decreased at the timing at which the second switch SW2 is switched to the on-state. In addition, the filter process is performed over the second filter time TF2 from when the second switch SW2 is switched to the on-state, during the period in which the first and second switches SW1 and SW2 are on-driven. As a result, effects similar to those according to the third embodiment can be achieved.

Variation Example According to the Sixth Embodiment

The second current threshold Ith2 may be changed in addition to the first current threshold Ith1, in a manner similar to that in FIG. 20, described above. In addition, regarding the first current threshold Ith1, the first small-current-side threshold I1L may be set to the off-period threshold IM.

Seventh Embodiment

Figure 23:
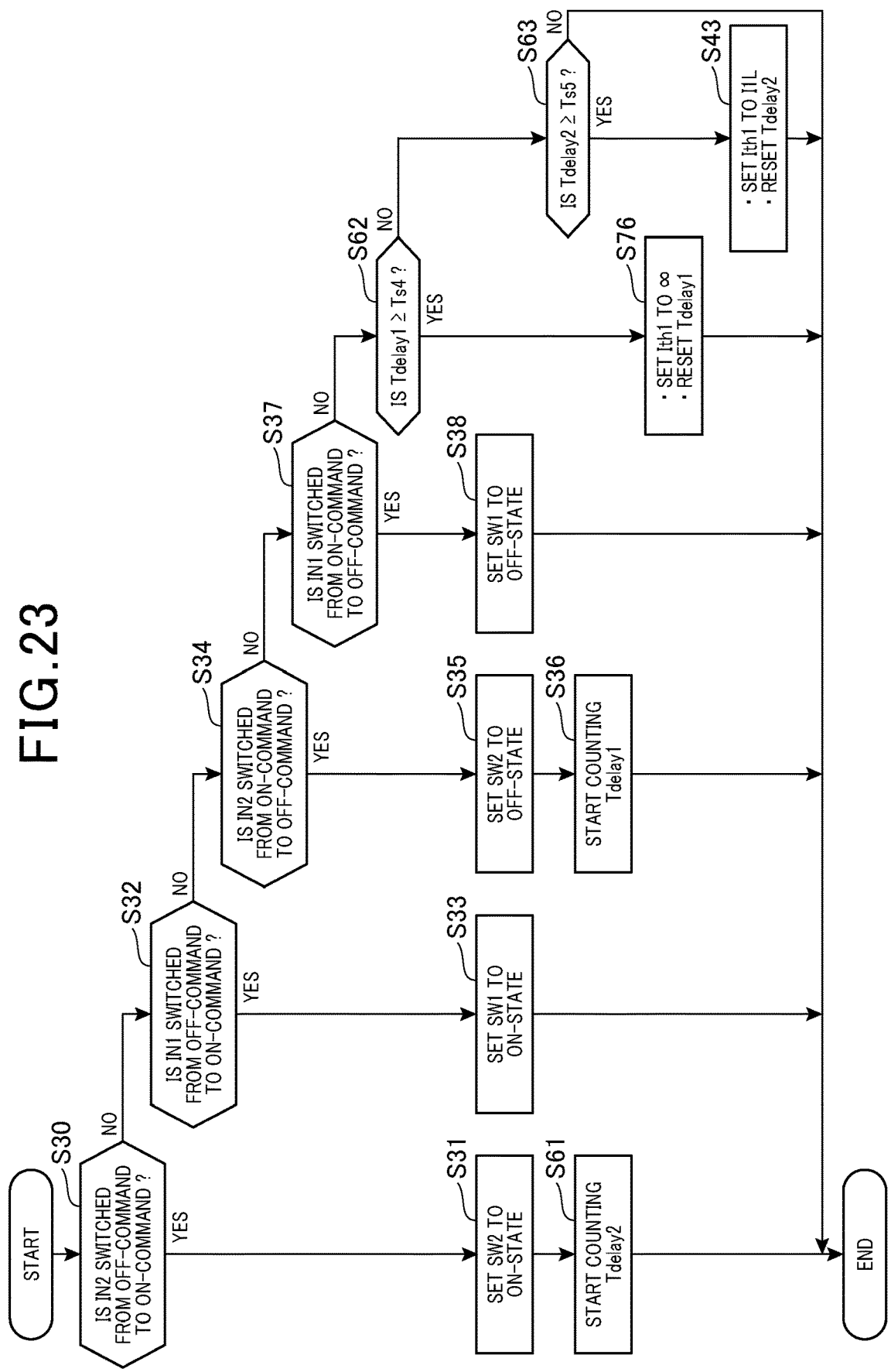
FIG. 23 is a flowchart of the steps in a threshold setting process according to a seventh embodiment.

A seventh embodiment will be described below with reference to the drawings, mainly focusing on the differences from the fifth embodiment. According to the present embodiment, instead of the process at step S41 in FIG. 18, the first current threshold Ith1 is increased to a value that is greater than a value that is assumed as a maximum value of the first sense voltage Vs1, as shown at step S76 in FIG. 23. Processes in FIG. 23 that are identical to those shown in FIG. 18, described above, are given the same reference numbers for convenience.

Figure 24:
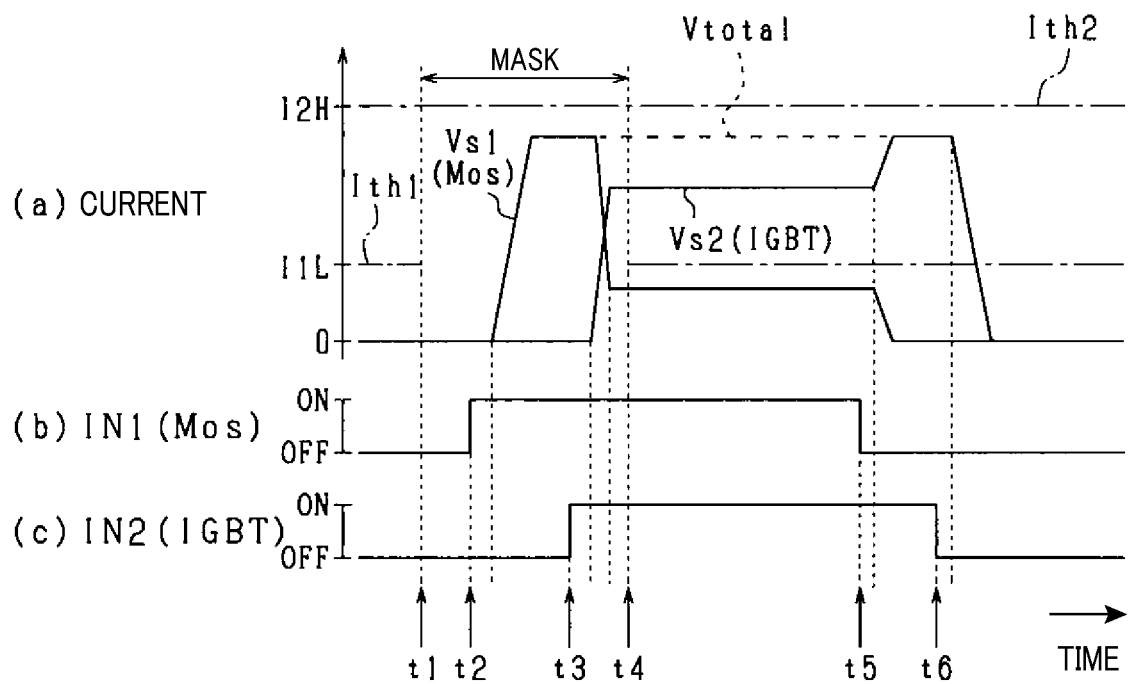
FIG. 24 is a timing chart of a threshold setting mode.

FIG. 24A to FIG. 24C show a setting mode of the first current threshold Ith1. In FIG. 24, (a) to (c) respectively correspond to (a) to (c) in FIG. 19, described above. As shown in FIG. 24, the first current threshold Ith1 is increased to a value that does not intersect with the first sense voltage Vs1 during a mask period from time t1 to time t4. According to the present embodiment described above, effects similar to those according to the sixth embodiment can be achieved.

Variation Example According to the Seventh Embodiment

The second current threshold Ith2 may be changed in addition to the first current threshold Ith1, in a manner similar to that in FIG. 20, described above. In addition, regarding the first current threshold Ith1, the first small-current-side threshold I1L may be set to the off-period threshold IM.

Eighth Embodiment

An eighth embodiment will be described below with reference to the drawings, mainly focusing on the differences from the fifth embodiment. According to the present embodiment, the target threshold set during the on-driving period of only the switching completion switch, of the first and second switches SW1 and SW2, is subsequently gradually decreased.

Figure 25:
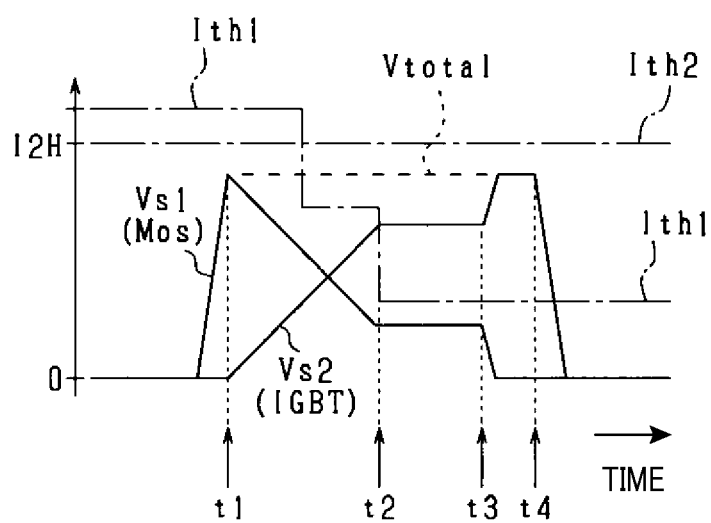
FIG. 25 is a timing chart of a threshold setting mode according to an eighth embodiment.

Specifically, as shown in FIG. 25, during a period from time t1 at which the second switch SW2 is switched to on-driving until time t2 after the first and second switches SW1 and SW2 are switched to the on-state, the first setting unit 53a decreases the first current threshold Ith1 from the first large-current-side threshold I1H to the first small-current-side threshold I1L in stages (stepwise).

In the example shown in FIG. 25, the first setting unit 53a decreases the first current threshold Ith1 in two stages. Here, at time t3, the first switch SW1 is switched to the off-state. At time t4, the second switch SW2 is switched to the off-state. The number of stages over which the first current threshold Ith1 is decreased is not limited to two stages and may be three stages or more.

Figure 26:
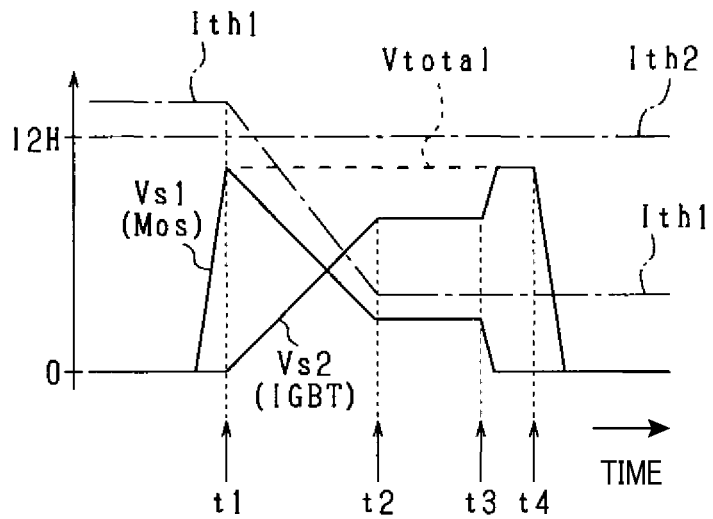
FIG. 26 is a timing chart of a threshold setting mode according to the eighth embodiment.

The mode by which the first current threshold Ith1 is decreased is not limited to the decrease in stages (stepwise). For example, as shown in FIG. 26, the first current threshold Ith1 may be continuously decreased. Time t1 to time t4 in FIG. 26 correspond to time t1 to time t4 in FIG. 25, described above.

According to the present embodiment as well, the second current threshold Ith2 may be changed in addition to the first current threshold Ith1.

Ninth Embodiment

A ninth embodiment will be described below with reference to the drawings, mainly focusing on the differences from the first embodiment. According to the present embodiment, the switch is forcibly switched to the off-state when the switch is in an overheating state, instead of when the switch is in the overcurrent state. A temperature of the switch is a physical quantity that has a positive correlation with the current that flows to the switch.

Figure 27:
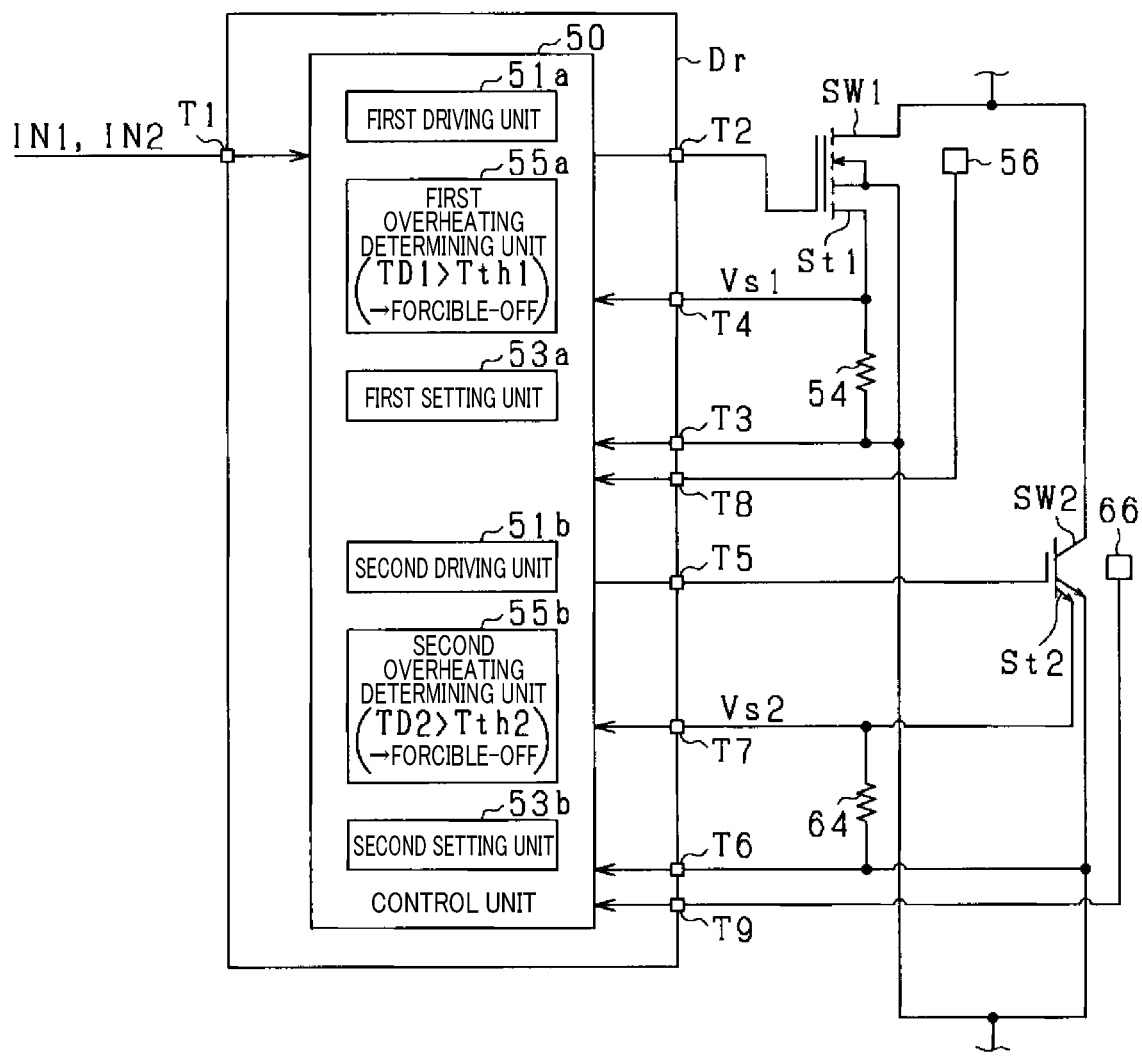
FIG. 27 is a diagram of a drive circuit according to a ninth embodiment.

FIG. 27 shows a drive circuit Dr according to the present embodiment. Configurations in FIG. 27 that are identical to those in FIG. 3, described above, are given the same reference numbers for convenience. A first temperature detecting unit 56 and a second temperature detecting unit 66 are provided near the drive circuit Dr.

The first temperature detecting unit 56 detects the temperature of the first switch SW1. The second temperature detecting unit 66 detects the temperature of the second switch SW2. For example, each of the temperature detecting units 56 and 66 is configured by a temperature-sensitive diode. A detection value of the first temperature detecting unit 56 is inputted to the control unit 50 via an eighth terminal T8. A detection value of the second temperature detecting unit 66 is inputted to the control unit 50 via a ninth terminal T9.

The control unit 50 includes a first overheating determining unit 55a. The first overheating determining unit 55a calculates a temperature TD1 of the first switch SW1 based on the acquired detection value of the first temperature detecting unit 56. When determined that the calculated temperature TD1 of the first switch SW1 exceeds a first temperature threshold Tth1, the first overheating determining unit 55a instructs the first and second drive units 51a and 51b to forcibly switch the first and second switches SW1 and SW2 to the off-state by off-driving.

The control unit 50 includes a second overheating determining unit 55b. The second overheating determining unit 55b calculates a temperature TD2 of the second switch SW2 based on the acquired detection value of the second temperature detecting unit 66. When determined that the calculated temperature TD2 of the second switch SW2 exceeds a second temperature threshold Tth2, the second overheating determining unit 55b instructs the first and second drive units 51a and 51b to forcibly switch the first and second switches SW1 and SW2 to the off-state by off-driving.

Here, setting of the first temperature threshold Tth1 and the second temperature threshold Tth2 based on the driving states of the first and second switches SW1 and SW2 can be performed by modes similar to the setting modes of the first current threshold Ith1 and the second current threshold Ith2 described according to the first to eighth embodiments.

Other Embodiments

The above-described embodiments may be modified in the following manner.

Figure 28A:
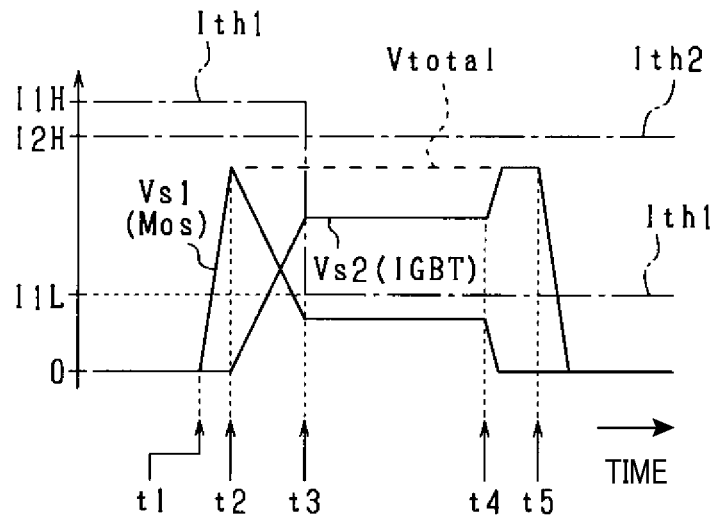
FIG. 28A to FIG. 28C are timing charts of a threshold setting mode according to a first modification.
Figure 28B:
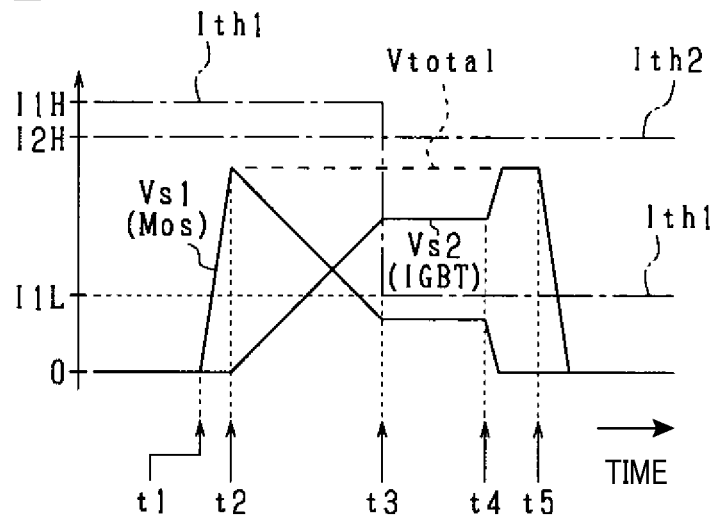
Figure 28C:
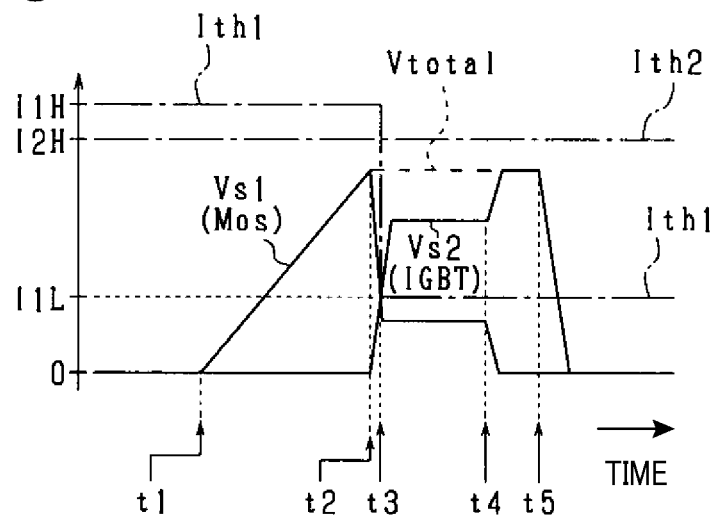

FIG. 28A to FIG. 28C show a first modification. As shown in FIG. 28A to FIG. 28C, a changing mode of the first current threshold Ith1 may be prescribed based on the switching speed of the switch. FIG. 28A to FIG. 28C show a case in which the AC assist process during turn-on, described according to the fifth embodiment, is performed. Time t1 to time t5 in FIG. 28B and FIG. 28C correspond to time t1 to time t5 in FIG. 28A.

The AC assist process may be performed during both turn-on and turn-off.

The configuration according to the eighth embodiment in which the first current threshold Ith1 is gradually decreased may be applied to the AC assist process during turn-on.

According to the first embodiment, the switch may be forcibly switched to the off-state when the sense voltage is determined to exceed the current threshold over a certain amount of time.

The current that flows to the switching completion switch may be estimated based on a current that flows to a switch other than the switching completion switch, among the plurality of switches that are connected in parallel to each other. The estimated current and a threshold may then be compared.

For example, when the switch that is to be subjected to the determination regarding whether or not an overcurrent is flowing thereto is the first switch SW1, the current that flows to the first switch SW1 may be estimated based on the current that flows to the second switch SW2. Whether or not an overcurrent is flowing to the first switch SW1 may be determined based on the estimated current.

In this case, for example, the first sense voltage Vs1 that is correlated with the current that flows to the first switch SW1 may be estimated based on a ratio of the on-resistance of the first switch SW1 to the on-resistance of the second switch SW2, and the second sense voltage Vs2.

A configuration may be used in which, for example, when the overcurrent determining unit determines that an overcurrent is flowing to the switch, a notification that an overcurrent is flowing is given to an external apparatus without the switch being forcibly switched to the off-state.

The combination of switches is not limited to that composed of the MOSFET and the IGBT.

The number of switches that are connected in parallel is not limited to two switches as is shown in FIG. 2. Three or more switches may be connected in parallel. A case in which three switches are connected in parallel will be described below. Here, the three switches are first to third switches SW1 to SW3. The first and second switches SW1 and SW2 are identical to the switches described according to the embodiments above. An IGBT that has the same current and voltage characteristics as the second switch SW2 is used as the third switch SW3 in this case.

Figure 29:
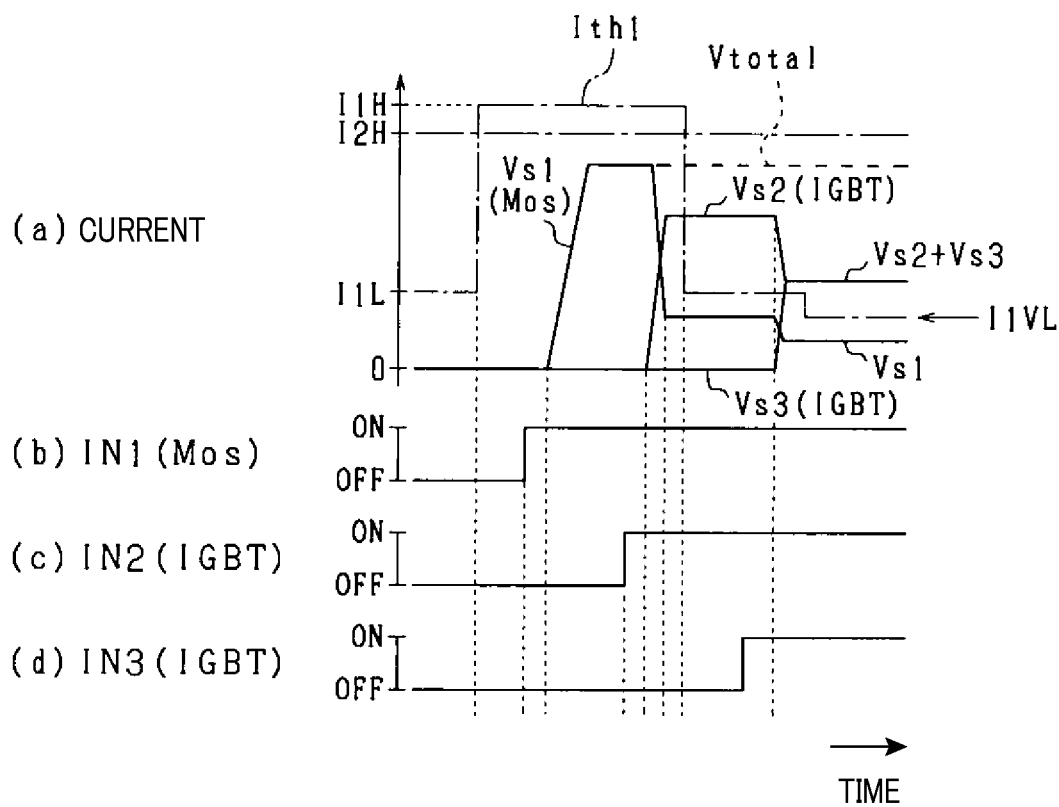
FIG. 29 is a timing chart of a threshold setting mode according to a second modification.

FIG. 29 shows a second modification that is an example of the AC assist process during turn-on. In FIG. 29, (a) to (c) respectively correspond to (a) to (c) in FIG. 19, described above. FIG. 29 shows, by (d), a third drive signal IN3 for on/off-driving the third switch SW3. In FIG. 29, Vs3 denotes a third sense voltage that is the sense voltage corresponding to the third switch SW3.

As shown in FIG. 29, the first to third switches SW1 to SW3 are successively switched to on-driving from a state in which all of the first to third switches SW1 to SW3 are being off-driven. Here, on-driving of the second switch SW2 is started after the first switch SW1 is switched to the on-state. On-driving of the third switch SW3 is started after the second switch SW2 is switched to the on-state.

In this case, the first switch SW1 that is the first to be switched to on-driving corresponds to the switching completion switch. In this presumed configuration, the first current threshold Ith1 is decreased in stages (stepwise) from the first large-current-side threshold I1H to the first small-current-side threshold I1L to a first very-small-current-side threshold I1VL (<I1L), as the number of switches that are on-driven increases.

The configuration in which the current threshold is decreased as the number of switches that are being on-driven increases can also be applied to a configuration in which four or more switches are connected in parallel. In addition, the configuration in which the current threshold is decreased as the number of switches that are being on-driven increases can also be applied to the AC assist process and the DC assist process during turn-on.

Furthermore, when the first to third switches SW1 to SW3 are successively switched to off-driving from a state in which all of the first to third switches SW1 to SW3 are being on-driven, the current threshold may be increased as the number of switches that are being off-driven increases. Specifically, for example, the current threshold may be increased stepwise (in stages).

The configuration in which the threshold is decreased as the number of switches that are being on-driven increases and the configuration in which the threshold is increased as the number of switches that are being off-driven increases can also be applied to the temperature threshold described according to the ninth embodiment.

Figure 30:
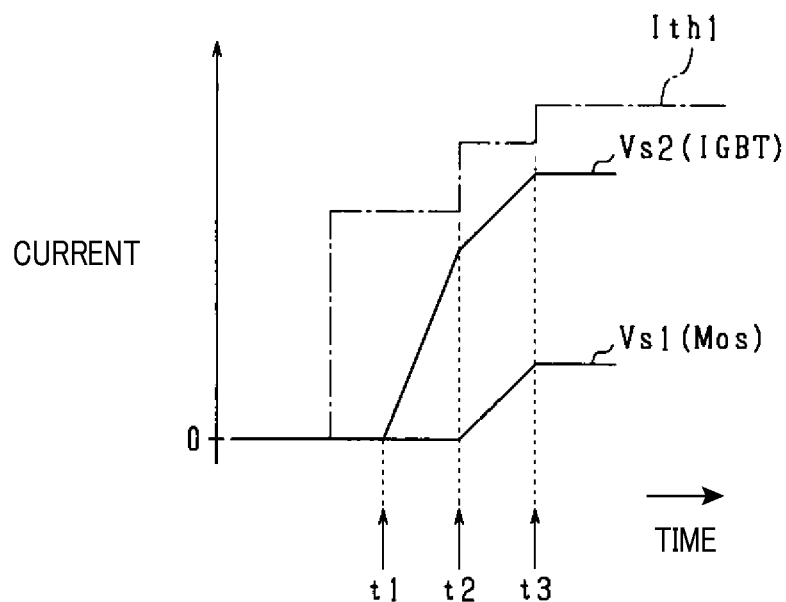
FIG. 30 is a timing chart of a threshold setting mode according to a third modification.

FIG. 30 shows a third modification. The gate voltage of the first switch SW1 starts to increase before time t1. As shown in FIG. 30, the first sense voltage Vs1 starts to increase at time t1. Meanwhile, the gate voltage of the second switch SW2 starts to increase from zero in the midst of the period from time t1 to time t2. Control to switch the second switch SW2 to the on-state is performed at time t2 at which the gate voltage of the first switch SW1 is increasing.

In this case, the first current threshold Ith1 during the on-period of only the first switch SW1 from time t1 to time t2 may be set to be less than that during the on-period of both the first and second switches SW1 and SW2 from time t2 to time t3. In the example shown in FIG. 30, the first current threshold Ith1 is further increased at time t3.

The inverter is not limited to the three-phase inverter and may be a two-phase inverter or an inverter with four or more phases. A power converter that is provided with the switches is not limited to the inverter.

What is claimed is:

1. A drive circuit driving a plurality of switches that are connected in parallel to each other, the plurality of switches including: (i) a switching completion switch that is driven to complete switching from one of a first state and a second state to the other one of the first state and the second state, the first state being a state in which a flow of current to at least one of the plurality of switches is allowed, and the second state being a state in which a flow of current to all of the plurality of switches is blocked, and (ii) at least one switch other than the switching completion switch, the drive circuit comprising:
a controller configured to:
determine whether a detection value of a detector exceeds a threshold value by comparing the detection value to the threshold value, the detector detecting a physical quantity that is correlated with the flow of current to at least one of the plurality of switches; and
set a target threshold value as the threshold value that is compared to the physical quantity correlated with the flow of current to the switching completion switch of the plurality of switches, the setting of the target threshold value is performed by (i) setting the target threshold value to a first target threshold during at least a part of a first on-driving period of time in which only the switching completion switch is driven to be in an ON state, and (ii) setting the target threshold value to a second target threshold during at least a part of a second on-driving period of time in which all of the plurality of switches are driven to be in the ON state, the first target threshold being greater than the second target threshold.

2. The drive circuit according to claim 1, wherein:
the at least one switch other than the switching completion switch of the plurality of switches is a first switch;
the switching completion switch of the plurality of switches is a second switch;
the first switch has an on-resistance, the on-resistance of the first switch in a small-current region, which is a region defined as smaller than a predetermined current, being lowest among the remaining switches, including the second switch, of the plurality of switches;

the second switch has an on-resistance, the on-resistance of the second switch in a large-current region, which is a region defined as equal to or larger than the predetermined current, being lowest among the remaining switches, including the first switch, of the plurality of switches; and the controller is configured to:
change the first switch to be driven in the ON state after changing the second switch to be driven in the ON state, and
upon both the first switch and the second switch being driven in the ON state, change the second switch to be driven in an OFF state after changing the first switch to be driven in the OFF state.

3. The drive circuit according to claim 2, wherein the controller is configured to not change the threshold value that is compared to the detection value of the detector corresponding to the first switch.

4. The drive circuit according to claim 2, wherein the controller is configured to:
increase the threshold value that is compared to the detection value of the detector corresponding to the first switch after a gate voltage of the second switch becomes equal to or higher than a threshold voltage of the second switch and the second switch is changed to the ON state; and
decrease the threshold value after a gate voltage of the first switch falls below a threshold voltage of the first switch and the first switch is changed to the OFF state.

5. The drive circuit according to claim 1, wherein:
the switching completion switch of the plurality of switches is a following off-switch;
the at least one switch other than the switching completion switch of the plurality of switches is a preceding off-switch;
a switching speed of the following off-switch is higher than a switching speed of the preceding off-switch; and
the controller is configured to, upon all of the plurality of switches being in the ON state, change the following off-switch to be in the OFF state after changing the preceding off-switch to the OFF state.

6. The drive circuit according to claim 5, wherein the controller is configured to increase the target threshold value before a gate voltage of the preceding off-switch falls below a threshold voltage of the preceding off-switch and the preceding off-switch is switched to the OFF state, after the preceding off-switch is switched to being driven in the OFF state.

7. The drive circuit according to claim 6, wherein the controller is configured to increase the target threshold value to a value that is greater than a maximum value of the detection value of the detector.

8. The drive circuit according to claim 5, wherein the controller is configured to:
increase the target threshold value at a time at which the preceding off-switch is switched to the OFF state; and
prevent use of the detection value of the detector during a predetermined period of time from a time at which the preceding off-switch is switched to being driven to the OFF state, during a period of time in which only the following off-switch is being driven to the ON state, among the plurality of switches.

9. The drive circuit according to claim 5, wherein the controller is configured to not change the threshold value that is compared to the detection value of the detector corresponding to the preceding off-switch.

10. The drive circuit according to claim 5, wherein the controller is configured to decrease the threshold value that is compared to the detection value of the detector corresponding to the preceding off-switch, after a gate voltage of the preceding off-switch falls below a threshold voltage of the preceding off-switch and the preceding off-switch is switched to the OFF state.

11. The drive circuit according to claim 10, wherein:
the following off-switch has an on-resistance in a small-current region, which is a region that is lower than a predetermined current, the on-resistance of the following off-switch being a lowest among the plurality of switches in the small-current region;
the preceding off-switch has an on-resistance in a large-current region, which is a region equal to or larger than the predetermined current, the on-resistance of the preceding off-switch being a lowest among the plurality of switches in the large-current region; and
a rated current of the preceding off-switch is larger than the predetermined current.

12. The drive circuit according to claim 1, wherein:
the switching completion switch of the plurality of switches is a following on-switch;
the at least one switch other than the switching completion switch of the plurality of switches is a preceding on-switch;
a switching speed of the preceding on-switch is higher than a switching speed of the following on switch; and
the controller is configured to, upon all of the plurality of switches being driven to the OFF state, change the following on-switch to be driven to the ON state after changing the preceding on-switch to be driven to the ON state.

13. The drive circuit according to claim 12, wherein the controller is configured to decrease the target threshold value after a gate voltage of the following on-switch becomes equal to or higher than a threshold voltage of the following on-switch and the following on-switch is switched to the ON state, after the following on-switch is switched to be driven to the ON state.

14. The drive circuit according to claim 13, wherein the controller is configured to increase the target threshold value to a value that is greater than a maximum value of the detection value of the detector, during a period of time from when the preceding on-switch is switched to be driven to the ON state until a gate voltage of the following on-switch becomes equal to or higher than a threshold voltage of the following on-switch and the following on-switch is switched to the ON state.

15. The drive circuit according to claim 12, wherein the controller is configured to:
decrease the target threshold value at a time when the following on-switch is switched to the ON state; and
prevent use of the detection value of the detector during a predetermined period of time from a time when the following on-switch is switched to be driven to the ON state, during a period of time in which all of the plurality of switches being driven to the ON state.

16. The drive circuit according to claim 12, wherein the controller is configured to not change the threshold value that is compared to the detection value of the detector corresponding to the following on-switch.

17. The drive circuit according to claim 12, wherein the controller is configured to increase the threshold value that is compared to the detection value of the detector corresponding to the following on-switch, before a gate voltage of the following on-switch becomes equal to or higher than a threshold voltage of the following on-switch and the following on-switch is switched to the ON state.

18. The drive circuit according to claim 17, wherein:
the preceding on-switch has an on-resistance in a small-current region, which is a region that is lower than a predetermined current, the on-resistance of the preceding on-switch being a lowest among the plurality of switches in the small-current region;
the following on-switch has an on-resistance in a large-current region, which is a region that is equal to or larger than the predetermined current, the on-resistance of the following on-switch being a lowest among the plurality of switches in the large-current region; and
a rated current of the following on-switch is larger than the predetermined current.

19. The drive circuit according to claim 1, wherein the controller is configured to:
successively switch the plurality of switches to being driven to the ON state from a state in which the plurality of switches are being driven to the OFF state; and
decrease the target threshold value as a number of switches of the plurality of switches that being driven to be the ON state increases.

20. The drive circuit according to claim 1, wherein the controller is configured to forcibly change the plurality of switches to the OFF state upon determining that the threshold value is exceeded.

\* \* \* \* \*